US012672299B2

(12) United States Patent
Kang et al.

(10) Patent No.: US 12,672,299 B2
(45) Date of Patent: Jun. 30, 2026

(54) VERTICAL TRANSPORT FIELD-EFFECT TRANSISTOR WITH LATE FIN CUT

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Julien Frougier, Albany, NY (US); Reinaldo Vega, Mahopac, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 833 days.

(21) Appl. No.: 18/063,987

(22) Filed: Dec. 9, 2022

(65) Prior Publication Data

US 2024/0339523 A1      Oct. 10, 2024

(51) Int. Cl.
H10D 30/01      (2025.01)
H10D 30/62      (2025.01)
(Continued)

(52) U.S. Cl.
CPC ....... H10D 30/024 (2025.01); H10D 30/6211 (2025.01); H10D 30/63 (2025.01); H10D 62/116 (2025.01); H10D 62/151 (2025.01)

(58) Field of Classification Search
CPC .. H10D 30/024; H10D 30/6211; H10D 30/63; H10D 62/116; H10D 62/151; H10D 64/017
See application file for complete search history.

(56) References Cited

U.S. PATENT DOCUMENTS 5,641,694  A      6/1997  Kenney
7,586,149  B2      9/2009  Yoon et al.
(Continued)

FOREIGN PATENT DOCUMENTS

CN      1310315  C      4/2007

OTHER PUBLICATIONS

Anonymous, "Sigma-shape Bottom EPI for V-FinFET," IP.com Electronic Publication Date: Apr. 14, 2017 IP, IP.com No. IPCOM000249841D, https://ip.com/IPCOM/000249841.
(Continued)

*Primary Examiner* — Britt Hanley
*Assistant Examiner* — Casey Paul Boatman
(74) *Attorney, Agent, or Firm* — Amin, Turocy & Watson, LLP

(57)      ABSTRACT

One or more devices and/or methods provided herein relate to a method for fabricating a semiconductor device, and more particularly for fabricating at least a portion of a vertical transport field effect transistor. The semiconductor device comprises a field-effect transmitter comprising a substrate, a fin extending outwardly from the substrate, a source/drain region having a first portion disposed between the substrate and the fin and stacked with the fin and the substrate along a common extension direction of the fin, and an excess section of semiconductor material disposed adjacent the first portion of the source/drain region and positioned other than stacked together with the substrate and the fin, wherein the semiconductor material of the excess section is different from a material of the fin and different from a material of the source/drain region.

13 Claims, 23 Drawing Sheets

(51) Int. Cl.
    *H10D 30/63*         (2025.01)
    *H10D 62/10*         (2025.01)
    *H10D 62/13*         (2025.01)

(56)              References Cited

U.S. PATENT DOCUMENTS

| | | |
|---|---|---|
| 10,141,446 B2 | 11/2018 | Niimi et al. |
| 10,141,448 B1 | 11/2018 | Miao et al. |
| 10,217,846 B1 | 2/2019 | Xie et al. |
| 10,236,379 B2 | 3/2019 | Bentley et al. |
| 10,396,151 B1 | 8/2019 | Li et al. |
| 11,056,588 B2 | 7/2021 | Wu et al. |
| 11,177,367 B2 | 11/2021 | Li et al. |
| 11,245,027 B2 | 2/2022 | Li et al. |
| 2019/0115452 A1 | 4/2019 | Cheng et al. |
| 2020/0075723 A1* | 3/2020 | Lee ...................... H10D 64/018 |
| 2021/0217871 A1* | 7/2021 | Li .......................... H10D 84/83 |
| 2021/0288181 A1* | 9/2021 | Kang ..................... H10D 30/63 |

OTHER PUBLICATIONS

Anonymous, "Method and Structure for Fabricating an Improved Vertical Field Effect Transistor with Uniform Fin Channel Width, Uniform Bottom Source/Drain Thickness and Uniform Shallow Trench Isolation (STI) Depth," IP.com Electronic Publication Date: Aug. 23, 2019, IP.com No. IPCOM000259584D, https://ip.com/IPCOM/000259584.

* cited by examiner

After FIN RIE

EW Patterning and RIE

Sigma FIN Lateral Etch

SiGe Isotropic Indentation

After Bottom Epitaxy Growth

After Removal of Liner

FIN Cut Patterning

FIN Cut SiARC Open and
Partial OPL RIE

Lithography for STI

After RX Patterning and
STI Formation

FIN Cut SiARC Open and
Partial OPL RIE

After RX Patterning and
STI Formation

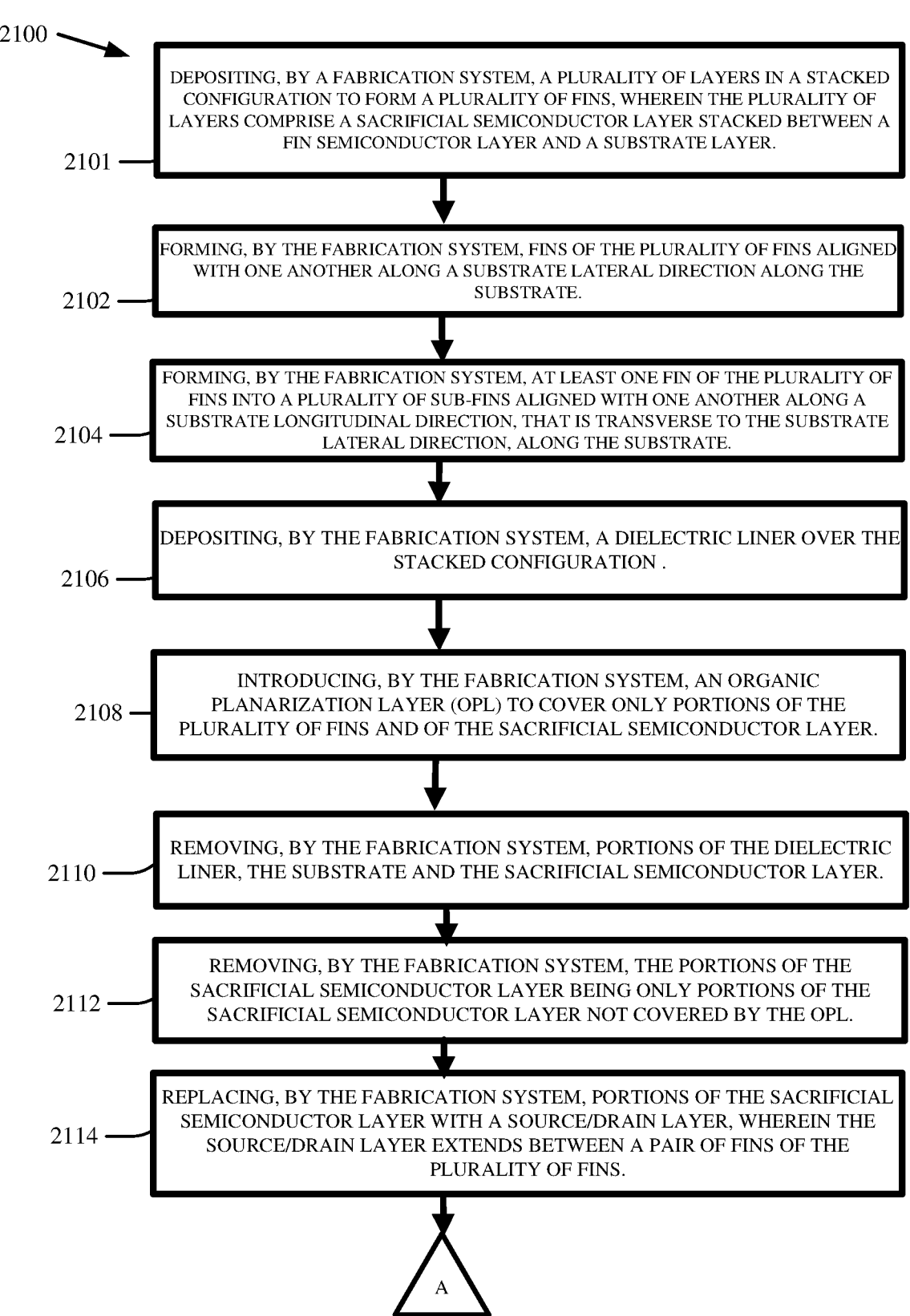

2100

2101 — DEPOSITING, BY A FABRICATION SYSTEM, A PLURALITY OF LAYERS IN A STACKED CONFIGURATION TO FORM A PLURALITY OF FINS, WHEREIN THE PLURALITY OF LAYERS COMPRISE A SACRIFICIAL SEMICONDUCTOR LAYER STACKED BETWEEN A FIN SEMICONDUCTOR LAYER AND A SUBSTRATE LAYER.

2102 — FORMING, BY THE FABRICATION SYSTEM, FINS OF THE PLURALITY OF FINS ALIGNED WITH ONE ANOTHER ALONG A SUBSTRATE LATERAL DIRECTION ALONG THE SUBSTRATE.

2104 — FORMING, BY THE FABRICATION SYSTEM, AT LEAST ONE FIN OF THE PLURALITY OF FINS INTO A PLURALITY OF SUB-FINS ALIGNED WITH ONE ANOTHER ALONG A SUBSTRATE LONGITUDINAL DIRECTION, THAT IS TRANSVERSE TO THE SUBSTRATE LATERAL DIRECTION, ALONG THE SUBSTRATE.

2106 — DEPOSITING, BY THE FABRICATION SYSTEM, A DIELECTRIC LINER OVER THE STACKED CONFIGURATION .

2108 — INTRODUCING, BY THE FABRICATION SYSTEM, AN ORGANIC PLANARIZATION LAYER (OPL) TO COVER ONLY PORTIONS OF THE PLURALITY OF FINS AND OF THE SACRIFICIAL SEMICONDUCTOR LAYER.

2110 — REMOVING, BY THE FABRICATION SYSTEM, PORTIONS OF THE DIELECTRIC LINER, THE SUBSTRATE AND THE SACRIFICIAL SEMICONDUCTOR LAYER.

2112 — REMOVING, BY THE FABRICATION SYSTEM, THE PORTIONS OF THE SACRIFICIAL SEMICONDUCTOR LAYER BEING ONLY PORTIONS OF THE SACRIFICIAL SEMICONDUCTOR LAYER NOT COVERED BY THE OPL.

2114 — REPLACING, BY THE FABRICATION SYSTEM, PORTIONS OF THE SACRIFICIAL SEMICONDUCTOR LAYER WITH A SOURCE/DRAIN LAYER, WHEREIN THE SOURCE/DRAIN LAYER EXTENDS BETWEEN A PAIR OF FINS OF THE PLURALITY OF FINS.

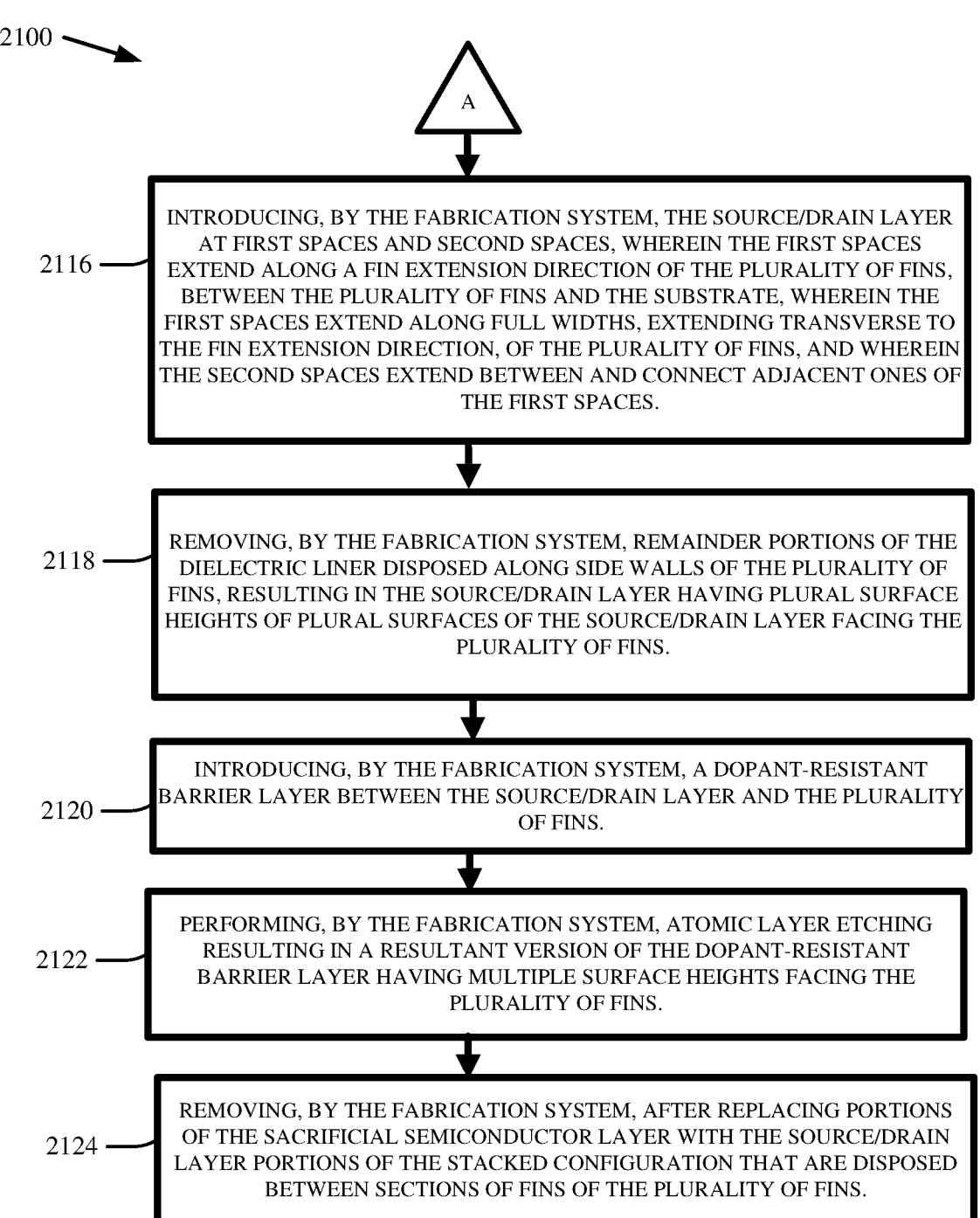

A

INTRODUCING, BY THE FABRICATION SYSTEM, THE SOURCE/DRAIN LAYER AT FIRST SPACES AND SECOND SPACES, WHEREIN THE FIRST SPACES EXTEND ALONG A FIN EXTENSION DIRECTION OF THE PLURALITY OF FINS, BETWEEN THE PLURALITY OF FINS AND THE SUBSTRATE, WHEREIN THE FIRST SPACES EXTEND ALONG FULL WIDTHS, EXTENDING TRANSVERSE TO THE FIN EXTENSION DIRECTION, OF THE PLURALITY OF FINS, AND WHEREIN THE SECOND SPACES EXTEND BETWEEN AND CONNECT ADJACENT ONES OF THE FIRST SPACES.

2116

REMOVING, BY THE FABRICATION SYSTEM, REMAINDER PORTIONS OF THE DIELECTRIC LINER DISPOSED ALONG SIDE WALLS OF THE PLURALITY OF FINS, RESULTING IN THE SOURCE/DRAIN LAYER HAVING PLURAL SURFACE HEIGHTS OF PLURAL SURFACES OF THE SOURCE/DRAIN LAYER FACING THE PLURALITY OF FINS.

2118

INTRODUCING, BY THE FABRICATION SYSTEM, A DOPANT-RESISTANT BARRIER LAYER BETWEEN THE SOURCE/DRAIN LAYER AND THE PLURALITY OF FINS.

2120

PERFORMING, BY THE FABRICATION SYSTEM, ATOMIC LAYER ETCHING RESULTING IN A RESULTANT VERSION OF THE DOPANT-RESISTANT BARRIER LAYER HAVING MULTIPLE SURFACE HEIGHTS FACING THE PLURALITY OF FINS.

2122

REMOVING, BY THE FABRICATION SYSTEM, AFTER REPLACING PORTIONS OF THE SACRIFICIAL SEMICONDUCTOR LAYER WITH THE SOURCE/DRAIN LAYER PORTIONS OF THE STACKED CONFIGURATION THAT ARE DISPOSED BETWEEN SECTIONS OF FINS OF THE PLURALITY OF FINS.

VERTICAL TRANSPORT FIELD-EFFECT TRANSISTOR WITH LATE FIN CUT

FIELD OF THE INVENTION

The present disclosure relates generally to fabrication methods and resulting structures for semiconductor devices, and more specifically, to methods and resulting structures for bottom source/drain etching with a fin-cut-last process for vertical transport field effect transistors.

BACKGROUND

A metal-oxide-semiconductor field effect transistor (MOSFET) is a transistor that can be used for amplifying or switching electronic signals. The MOSFET conventionally has a source, a drain and a metal oxide gate electrode. The metal gate is electrically insulated from the main semiconductor n-channel or p-channel by a thing layer of insulating material, such as silicon dioxide or glass, which can make the input resistance of the MOSFET relatively high. The gate voltage controls whether the path from drain to source is an open circuit ("off") or a resistive path ("on").

A fin-type field effect transistor (FinFET) is a type of nonplanar MOSFET. FinFET devices include an arrangement of fins disposed on a substrate. The fins can be formed at least partially from a semiconductor material. A gate stack can be arranged over the fins and the portion of the fin that is under the gate defines a channel region of the fins. Regions of the fins that are not under the gate can define active source and drain regions of the device.

Another nonplanar MOSFET that uses fin-shaped structures is a vertical FET (VFET). A VFET operates like a FinFET that is horizontal. However, in a VFET, also herein referred to as a vertical transport field effect transistor (VTFET), an entire fin can function as a channel. The source and drain regions are positioned at respective ends of the vertically positioned fin such that the current runs vertically from source to drain. A gate of a VTFET can wrap around the fin-shaped channel.

SUMMARY

The following presents a summary to provide a basic understanding of one or more embodiments described herein. This summary is not intended to identify key or critical elements, and/or to delineate scope of embodiments or scope of claims. Its sole purpose is to present concepts in a simplified form as a prelude to the more detailed description that is presented later. In one or more embodiments described herein, systems, methods and/or apparatuses can facilitate a process to manufacture and/or employ a semiconductor device, such as a VTFET having epitaxial material directly under a fin channel to facilitate more rapid, direct and efficient current between the epitaxial material and another source/drain region, across the fin (e.g., along a long length of the fin).

In accordance with one or more embodiments, a semiconductor device comprises a field-effect transmitter comprising a substrate, a fin extending outwardly from the substrate, a source/drain region having a first portion disposed between the substrate and the fin and stacked with the fin and the substrate along a common extension direction of the fin, and an excess section of semiconductor material disposed adjacent the first portion of the source/drain region and positioned other than stacked together with the substrate and the fin, wherein the semiconductor material of the excess section is different from a material of the fin and different from a material of the source/drain region.

In accordance with another embodiment, an electronic structure comprises a substrate, a fin extending outwardly from the substrate and having a fin surface facing towards the substrate, and a source/drain region having a first portion disposed between the substrate and the fin, wherein the first portion is stacked together with the substrate and the fin along an extension direction of the fin, wherein the first portion has a first surface facing towards the fin surface, wherein the source/drain region has a second portion disposed adjacent to the first portion and positioned other than stacked together with the substrate and the fin, wherein the second portion has a second surface facing towards the fin surface, and wherein a first distance along the extension direction of the fin between the fin surface and the first surface is less than a second distance along the extension direction of the fin between the fin surface and the second surface.

In accordance with still another embodiment, a method for fabricating an electronic structure by a fabrication system comprises depositing, by the fabrication system, a plurality of layers in a stacked configuration to form a plurality of fins, wherein the plurality of layers comprise a sacrificial semiconductor layer stacked between a fin semiconductor layer and a substrate layer, replacing, by the fabrication system, portions of the sacrificial semiconductor layer with a source/drain layer, wherein the source/drain layer extends between a pair of fins of the plurality of fins, and removing, by the fabrication system, after replacing portions of the sacrificial semiconductor layer with the source/drain layer, portions of the stacked configuration that are disposed between sections of fins.

In accordance with yet another embodiment, a method for using a semiconductor device comprises directing a current across a long length of a fin of the semiconductor device, the current being directed between an epitaxial material disposed directly along an extension direction of the fin and another source drain region opposite the epitaxial material across the fin, wherein the epitaxial layer has plural surface heights of plural surfaces of the epitaxial layer facing the fin.

An advantage of the aforementioned method can be an ability to provide a fin and epitaxial material with more efficient respective profiles. Indeed, a resultant VTFET can allow current flow from one source/drain region to another source/drain region in a shortest path directly along a fin of a VTFET, which can therefor provide lower resistance for the current flow. This can be at least because one epitaxial source/drain region can be formed directly underneath a channel of the VTFET.

DESCRIPTION OF THE DRAWINGS

FIG. 21 illustrates a flow diagram of an example method of fabrication of an electronic device, in accordance with one or more embodiments described herein.

FIG. 22 illustrates a continuation of the flow diagram of the example method of fabrication of an electronic device of FIG. 21, in accordance with one or more embodiments described herein.

DETAILED DESCRIPTION

Figure 1:
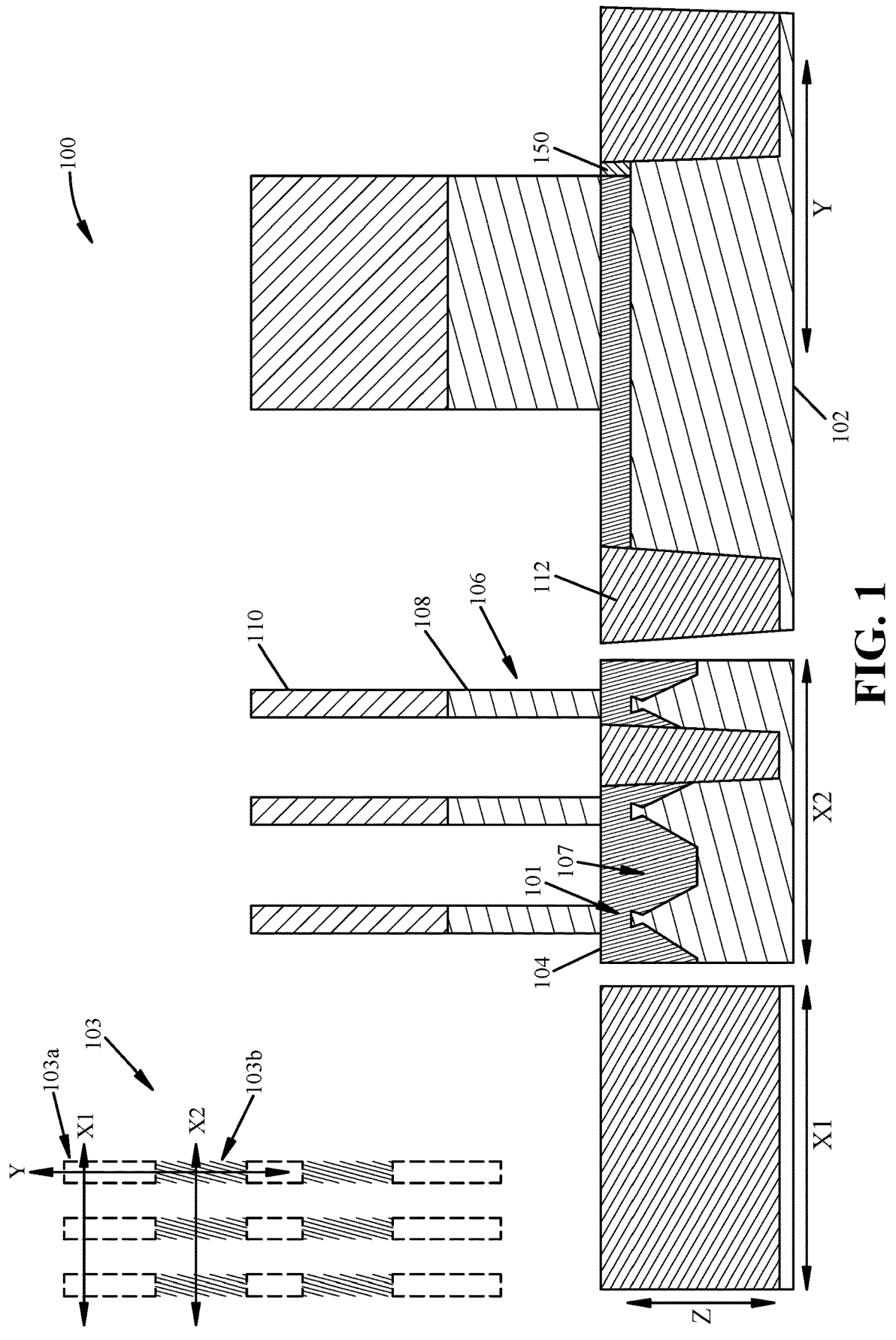
FIG. 1 illustrates a schematic diagram of a first electronic structure, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section or in the Detailed Description section. One or more embodiments are now described with reference to the drawings, wherein like reference numerals are utilized to refer to like elements throughout. In the following description, for purposes of explanation, numerous details are set forth in order to provide a more thorough understanding of the one or more embodiments. However, in various cases, one or more embodiments can be practiced without these details.

Discussion is provided herein relative to configuration, including fabrication, of an electronic structure that can comprise and/or be comprised by a semiconductor. In one or more embodiments, the electronic structure can be configured for use in a quantum system. However, as there are many uses for devices comprising semiconductors, the discussion herein need not apply solely to quantum computer electronics, but can also apply to many other control, radio, radar, cryogenic and/or signal-based applications, among others. Description and discussion herein are therefore not limited to use in a quantum computing system.

Turning first to existing frameworks for electronic structure fabrication, such as semiconductor fabrication, some such existing semiconductors can comprise fins. These fins can define channels along which current can be directed from a first source/drain region to a second source/drain region, across the fins. In existing VTFETs, a substrate (e.g., silicon substrate) can extend through a source/drain region (e.g., bottom epaxial section or bottom source/drain region) and connect with at least a portion of the fins. Fins, such as each fin, can comprise at least a stacked section of silicon. This section can be formed from or stacked on the substrate. Accordingly, the bottom epaxial section can be formed (e.g., grown) only in valleys between such fins (e.g., where the silicon of the silicon substrate and fins form the valleys).

Put another way, the bottom epaxial section is not disposed directly beneath the fins (e.g., is not disposed at sections 101, FIG. 1 in existing VTFET frameworks). Thus, the bottom epaxial section is not disposed directly beneath the channels in existing VTFET frameworks.

Likewise, a shape of the fins is such that the fins do not extend into the epaxial material of the respective source/drain regions. As a result of these aspects, travel of current and/or other electric signal between respective source/drain regions, and across the fins, can be inefficient and provide resistance. This resistance can be caused by a non-linear path between respective source/drain regions.

To account for one or more of these deficiencies of existing VTFET frameworks and VTFET fabrication frameworks, one or more embodiments described herein can provide a VTFET having the bottom epaxial section directly beneath a fin channel, and further can provide a unique fabrication method for easily and efficiently providing for this bottom epaxial section of a VTFET.

Figure 2:
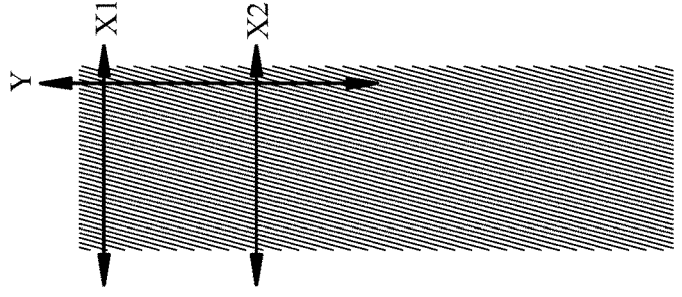
FIG. 2 illustrates a schematic diagram of an initial stacking step for the electronic structure of FIG. 1, in accordance with one or more embodiments described herein.

The one or more embodiments described herein can be constructed by one or more fabrication systems at one or more different steps and/or stages. However, for case of illustration, a single fabrication system 256 is generally illustrated at FIG. 2. It is appreciated that such fabrication system 256 can comprise various fabrication elements at one or more fabrication locations.

Such fabrication can result in the various embodiments of VTFETs described herein (e.g., electronic structures 100, 1500 and/or 1600), each having one or more resultant artifacts and/or elements resulting from the particular fabrication steps, and thus providing a fingerprint or mark corresponding to the various fabrication steps described herein. Once such element can be an excess section 150 of semiconductor material at FIG. 1 and electronic structure 100, such as undoped semiconductor material, to be described below in greater detail. Another such element can be the particular varying surface heights of the epitaxial material of the source/drain region 104, also illustrated at FIG. 1 and electronic structure 100, and also to be described in greater detail below.

One or more embodiments will now be described with reference to the drawings, where like referenced numerals are used to refer to like elements throughout. In the following description, for purposes of explanation, numerous details are set forth in order to provide a more thorough understanding of the one or more embodiments. However, in various cases, that the one or more embodiments can be practiced without these details.

As used herein, the terms "on" and "above" can be used in a context, as is customary, to indicate orientation or relative position in a vertical or orthogonal direction to the surface of the substrate, for example in a vertical z-direction.

As used herein, the terms "lateral" and/or "laterally" can be used, as is customary, to indicate orientation generally parallel to the plane of the substrate, as opposed to generally vertically or outwardly, from the substrate surface.

As used herein, the terms "vertical" and/or "vertically" can be used, as is customary, to indicate orientation generally orthogonal (e.g., vertical z-direction) to the plane of the substrate, and thus also in a direction outward from the plane of the substrate, as opposed to generally laterally along the substrate surface.

As used herein, the term "arranged on/at" can be understood in a broad sense and shall include embodiments according to which an intermediate layer, such as an insulating layer, can be arranged between a substrate/ground plane/ground and a respectively described layer/structure. Hence the terms "arranged on" and/or "arranged at" can comprise the meaning of "arranged above."

As used herein, the terms "entity." "requesting entity" and "user entity" can refer to a machine, device, component, hardware, software, smart device and/or human.

As used herein, the term "electronic chip" can refer to, but must not always refer to, a silicon chip. As used herein, the term "silicon chip" can refer to a chip comprising silicon and/or any other material.

Generally, the subject computer processing system, methods, apparatuses, devices and/or computer program products can be employed to solve new problems that can arise through advancements in technology, computer networks and/or the Internet.

Further, the one or more embodiments depicted in one or more figures described herein are for illustration only, and as such, the architecture of embodiments is not limited to the systems, devices and/or components depicted therein, nor to any particular order, connection and/or coupling of systems, devices and/or components depicted therein.

Turning first generally to FIG. 1, an embodiment of an electronic structure, a semiconductor device, and indeed a VTFET, is illustrated at 100. As will be described, the electronic structure 100 provides less resistance for signal travel across fin channels than existing VTFET structures.

Generally, the electronic structure 100 comprises a fin 106 comprising a fin-forming layer 108 of semiconductor material, a hard mask layer 110 that can be removed, a source/drain region 104 of epitaxial material, a substrate layer 102 of semiconductor material, a shallow trench isolation (STI) region 112 and an excess section 150 of undoped semiconductor material. The source/drain region 104 has varying surface heights including a first height directly beneath the fin-forming layer 108 and a second and lower height adjacent the fins 106. The fin-forming layer 108 and the substrate layer 102 can be comprised of the same material or of different materials.

Figure 13:
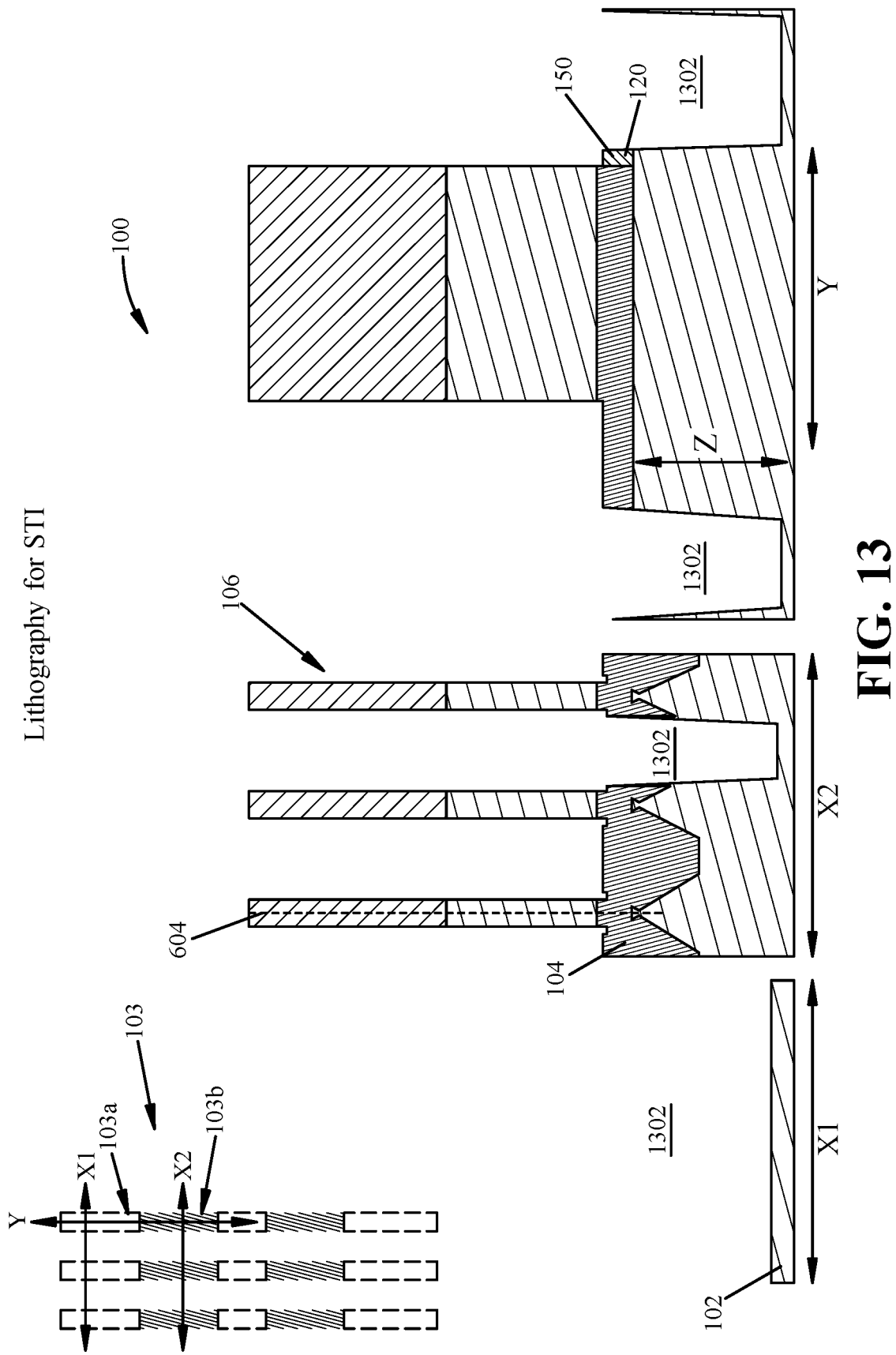
FIG. 13 illustrates a schematic diagram of an STI lithography step for the electronic structure of FIG. 1, in accordance with one or more embodiments described herein.
Figure 14:
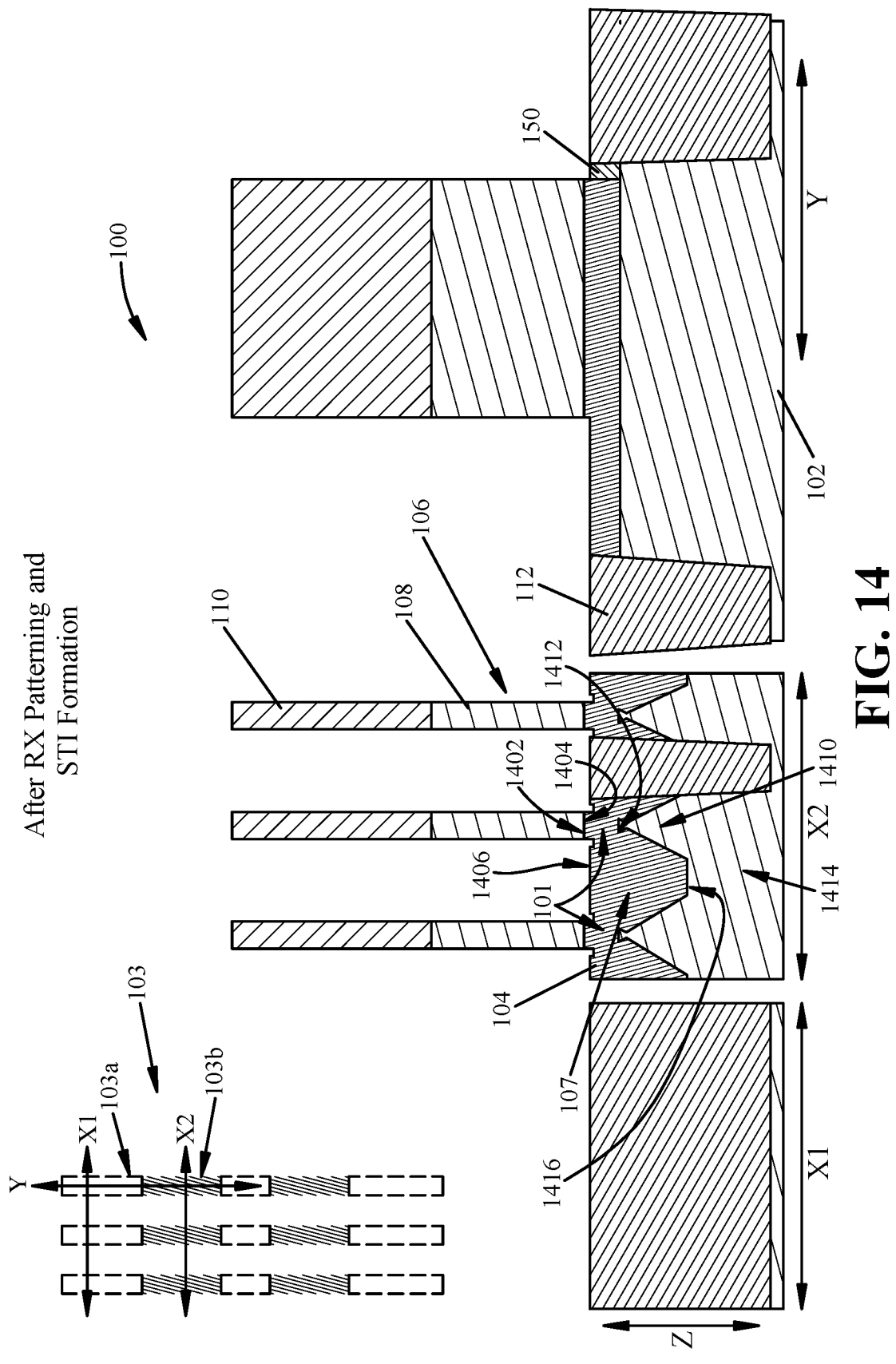
FIG. 14 illustrates again the resultant schematic diagram of the first electronic structure of FIG. 1, in accordance with one or more embodiments described herein.

One or more fabrication steps are now described relative to FIGS. 2 to 14 for forming the electronic structure 100 of FIG. 1 (also illustrated again at FIG. 14). The FIGS. 2 to 14 and the steps represented by these figures are generally provided in a chronologically performed order, however one or more steps may be performed in a different order location where suitable.

Turning first to FIG. 2, but applicable to any of the electronic structures 100, 1500 and/or 1600 of any of FIGS. 1 to 20, in one or more embodiments, one or more operations for fabricating the one or more electronic structures described herein can be performed by a manufacturing system, such as a fabrication system 256 comprising one or more manufacturing devices 258. The fabrication system 256 can be operatively coupled to a processor 259 for at least partially controlling the one or more operations described herein. The processor 259 can be any suitable processor. Discussion provided below with respect to processor 2310 can be at least partially equally applicable to the processor 259.

In one or more embodiments, the fabrication system 256 can be configured, such as by one or more operations performed by one or more of the manufacturing devices 258 in view of one or more instructions provided by the processor 259, to construct the electronic structure 100, such as relative to and/or on a substrate. The one or more manufacturing devices 258 can, perform, among other operations, one or more depositions (e.g., liner deposition), transfer, etching, cutting, printing, growing, placement, lasering, removal, radiation, irradiation, adhesive operations, metallization operations, welding, electroplating and/or other plating methods, component location and/or fastener attachment.

Turning now particularly to the fabrication steps for the electronic structure 100, at each figure a directional key is provided to illustrate relative X and Y axes corresponding to portions of the assembly 103 of the electronic structure 100 being illustrated. At each directional key, cut regions 103*a* represent cut regions (e.g., areas that are to be finally cut away), and fin regions 103*b* represent fin regions (e.g., areas that are not to be finally cut away). At each illustration, illustrated electronic structure portions are shown in cross-section as would be viewed along the particular X1, X2 and Y axes of as illustrated at the directional key.

Referring first to FIG. 2, an initial stacking step can be performed by placing and/or depositing layers atop a substrate, such as a silicon substrate layer 102. An undoped and sacrificial semiconductor layer 120 (e.g., a silicon-based material such as silicon-germanium/SiGe) can be deposited on top of the substrate layer 102, a silicon fin-forming layer 108 on top of the sacrificial semiconductor layer 120, and a hard mask layer 110 on top of the silicon fin-forming layer 108. Although the fin-forming layer 108 is shown in the figures as having a same material as the substrate layer 102, in one or more embodiments, the fin-forming layer 108 can have a different material composition than the substrate layer 102.

Figure 3:
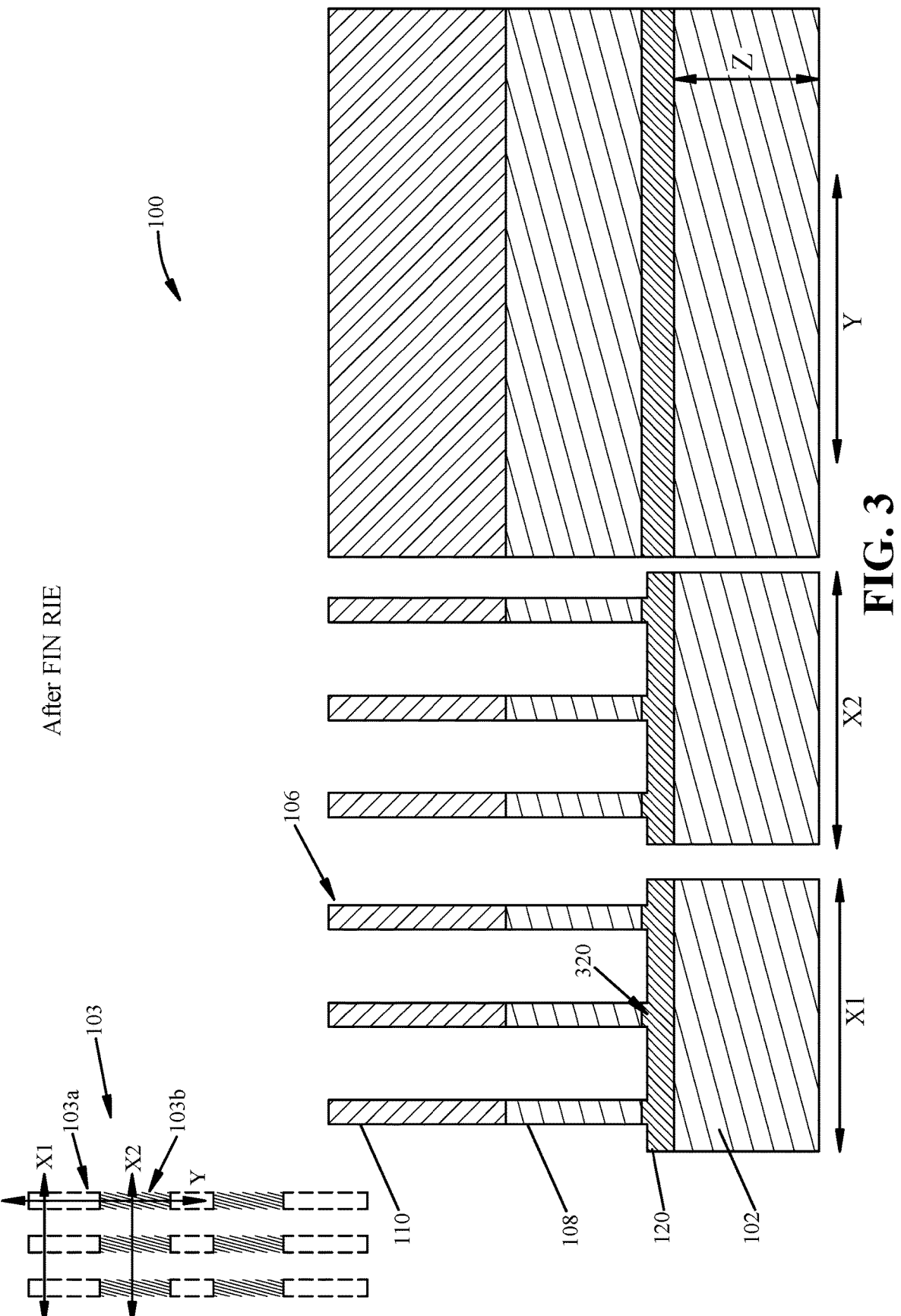
FIG. 3 illustrates a schematic diagram of another fabrication step for the electronic structure of FIG. 1, in accordance with one or more embodiments described herein.

At FIG. 3, a subsequent step can comprise etching, such as reactive ion etching (RIE), to form fins 106 from the stacked layers of silicon fin-forming layer 108 and hard mask layer 110. As illustrated, various fins 106 can result that extend along the vertical z-axis and also along the Y axis through regions 103*a* and 103*b*. It is noted that a portion 320 of the sacrificial semiconductor layer 120 forms a base portion of one or more fins 106. That is, the cut/etching operation to form the fins 106 extends through the hard mask layer 110, the silicon fin-forming layer 108 and at least a portion of the sacrificial semiconductor layer 120.

Figure 4:
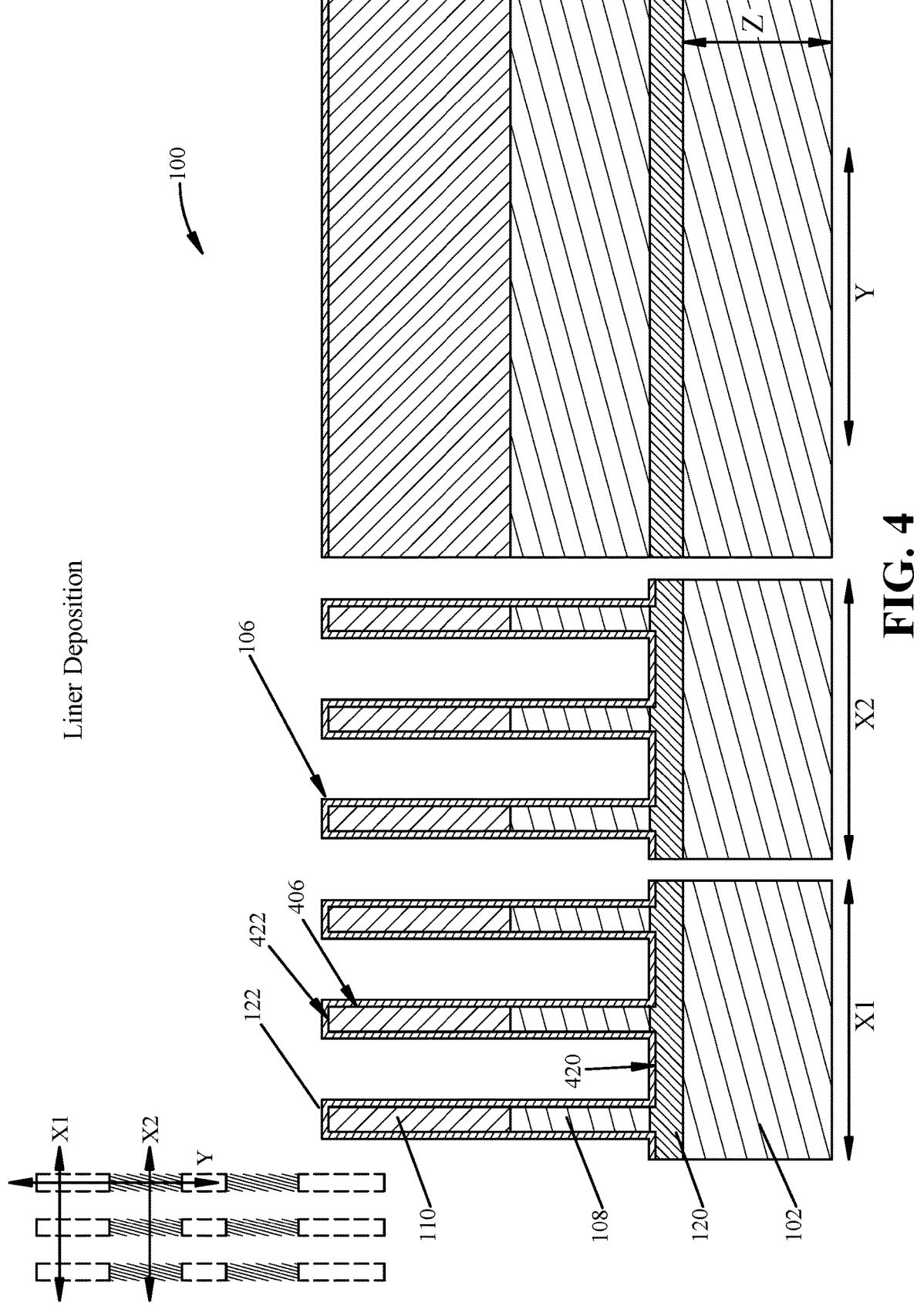
FIG. 4 illustrates a schematic diagram of a liner deposition step for the electronic structure of FIG. 1, in accordance with one or more embodiments described herein.

At FIG. 4, a subsequent step can comprise deposition of a liner layer 122 (also herein referred to as a liner deposit). The liner layer 122 can be comprised of a dielectric material such as silicon oxide or silicon oxynitride. The liner layer 122 can be applied along all upper surfaces 420 of the sacrificial semiconductor layer 120 and along all side surfaces 406 and upper surfaces 422 of the fins 106 (e.g., comprised of hard mask layer 110 and silicon fin-forming layer 108 at FIG. 4). As used herein, "upper surfaces" can refer to surfaces facing directly oppositely away from the silicon substrate layer 102 along the z-axis. The liner layer 122 can protect the material of the channel/fin 106 from subsequent etching, RIE and/or other material-removal operations.

Figure 5:
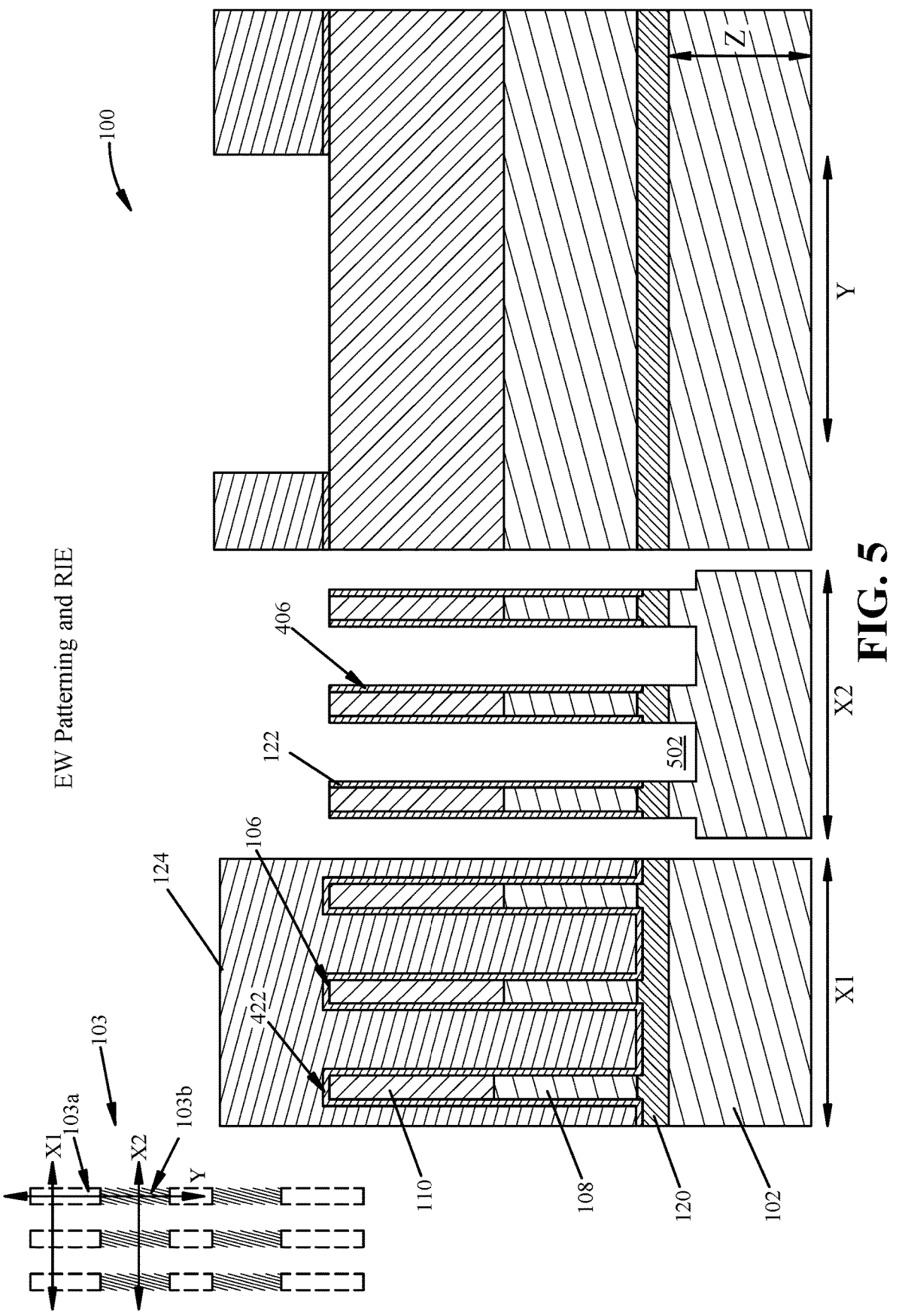
FIG. 5 illustrates a schematic diagram of another fabrication step for the electronic structure of FIG. 1, in accordance with one or more embodiments described herein.

At FIG. 5, a subsequent step can generally comprise EW patterning and additional RIE. This step can more particularly comprise deposition and/or coating, such as spin-coating, of an organic planarization layer (OPL) 124 (e.g., a carbon-based material) over portions of the fins 106 extending along the Y-axis, which portions define channels of the electronic structure 100 that are not being further modified at one or more subsequent steps (e.g., illustrated at FIGS. 6 and 7). That is, cut regions 103*a* are not further modified and have the OPL 124 deposited thereon, while the fin regions 103*b* do not receive the OPL deposit. See, for example, the cross-section taken along the Y-axis illustrating this difference.

The step illustrated at FIG. 5 also can comprise cutting/etching, such as RIE, of upper portions of all aspects not covered by the OPL 124. This can include RIE of portions of the sacrificial semiconductor layer 120 and the silicon substrate layer 102 between the fins, where "between" is with reference to direction along the X axes. The etching can proceed through a full thickness (along the Z-axis) of the sacrificial semiconductor layer 120 and at least partially into (along the Z-axis) the silicon substrate layer 102. As a result, fin regions 103*b* of the assembly 103 (e.g., which will not be cut away), can comprise valleys 502 formed in between the channels, in which source/drain material can be grown, deposited, printed and/or the like.

The RIE also can remove at least the liner layer 122 at the upper surfaces 422 of the fins 106 that are not covered by the OPL 124. As a result, for fins 106 that are not covered by the OPL 124, only liner layer 122 at side surfaces 406 can remain.

Figure 6:
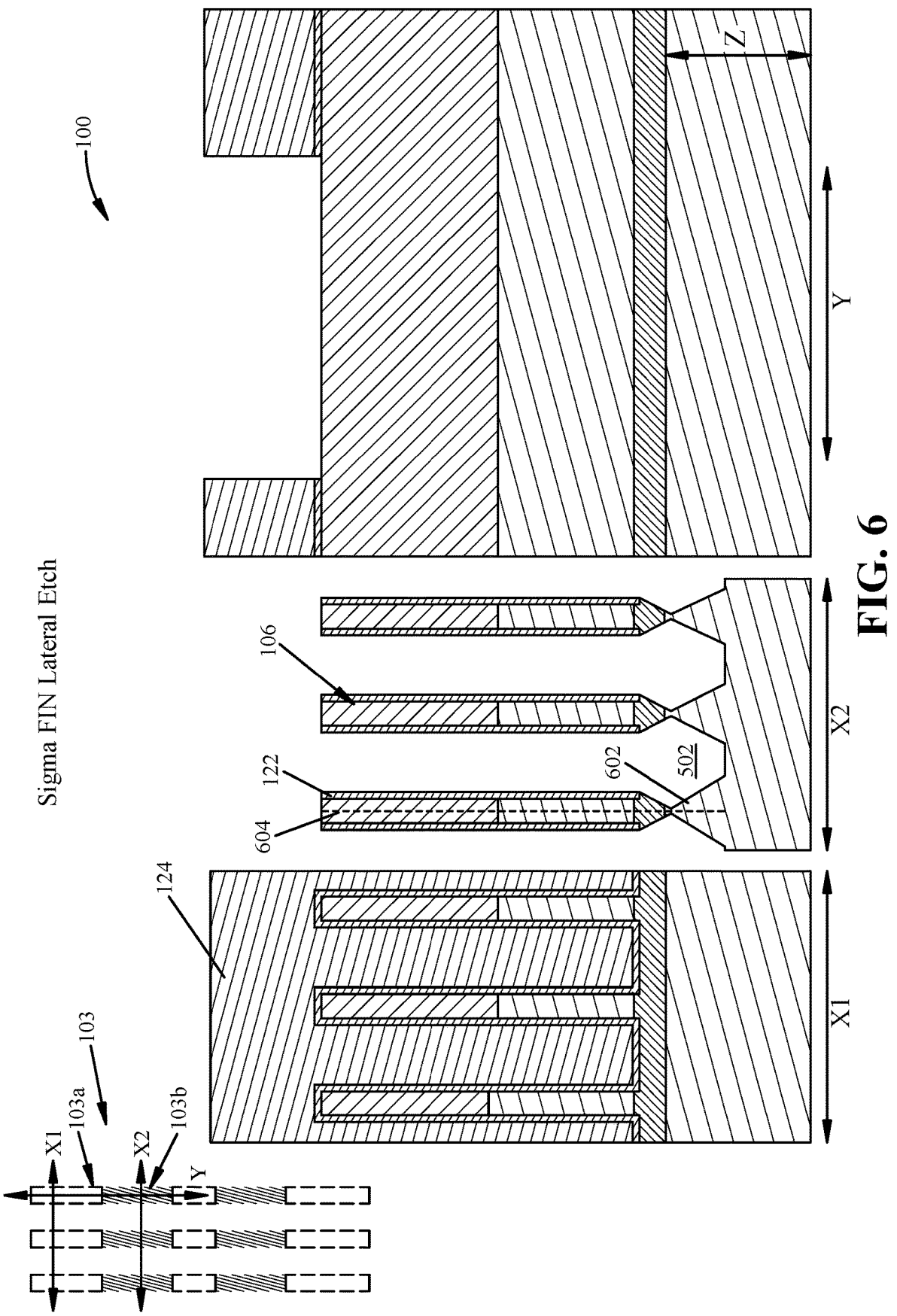
FIG. 6 illustrates a schematic diagram of another fabrication step for the electronic structure of FIG. 1, in accordance with one or more embodiments described herein.

Next, at FIG. 6, a subsequent step can comprise sigma fin lateral etching. This can comprise lateral etching at walls forming sides of the valleys 502, resulting in much-reduced silicon substrate layer 102 beneath the fins (e.g., directly along an extension direction of the channels). The resulting side walls 602 can be angled away from one another and inwardly towards respective central longitudinal axes 604 of the fins 106, thus defining concave sides of the resulting valleys 502. These greater valley 502 openings can provide greater area for growth and/or deposit of source/drain material beneath the fins (e.g., directly along extension directions of the channels).

Along the central longitudinal axes 604, a thinnest section along the X2-axis is disposed at the silicon substrate layer 102. Nonetheless, it is noted that fin collapse is prevented due to the support from the longitudinally adjacent (e.g., along the Y-axis) cut regions 103*a* (such as along the X1-axis.

Figure 7:
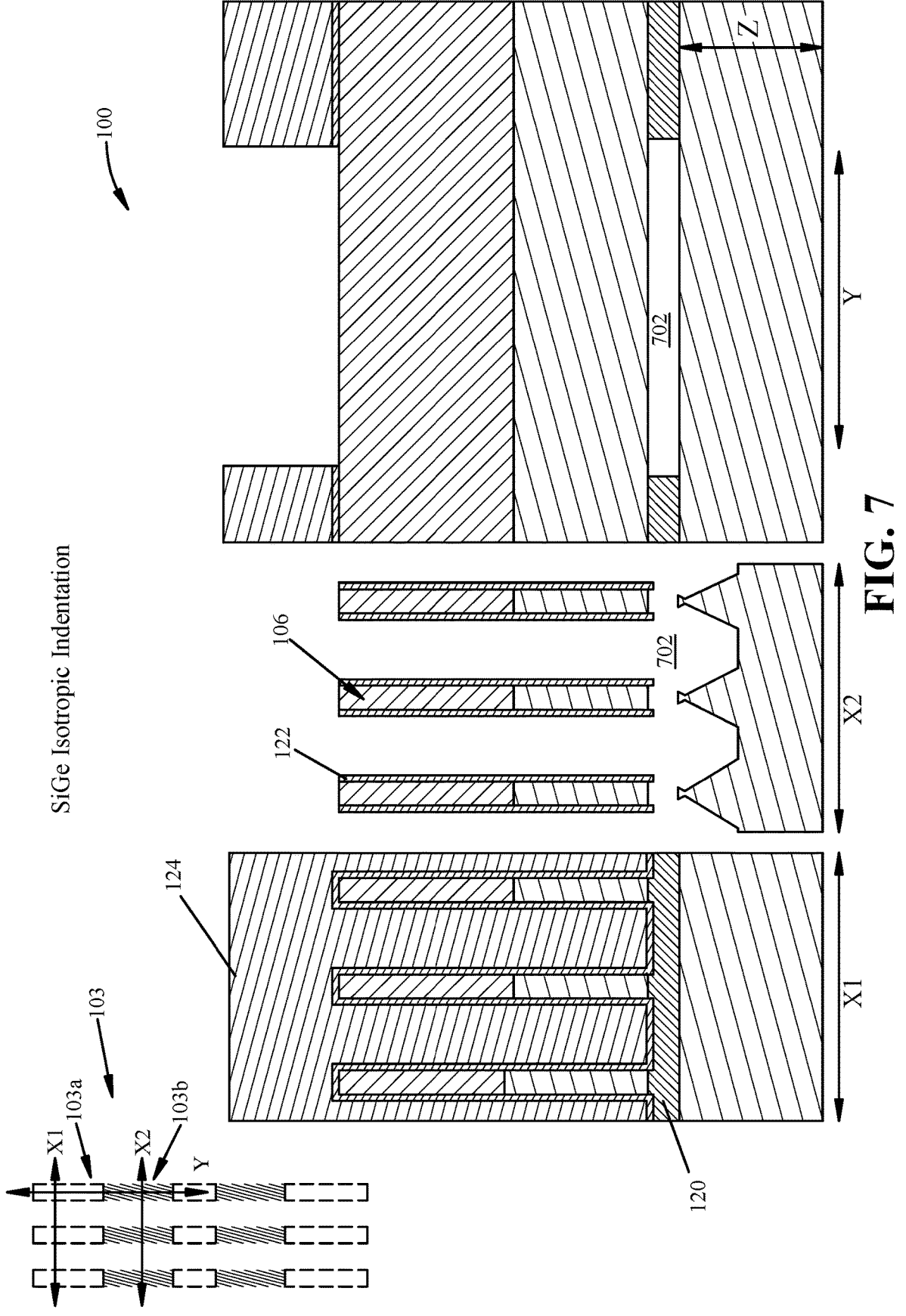
FIG. 7 illustrates a schematic diagram of another fabrication step for the electronic structure of FIG. 1, in accordance with one or more embodiments described herein.

At FIG. 7, an isotropic indentation of the sacrificial semiconductor layer 120 is performed. This etching is performed only at the fin regions 103*b* that are not covered by the OPL 124. As a result, at the fin regions 103*b* (e.g., along the X2-axis), a space 702 extends laterally fully across the X2-axis. This space 702 separates the fins 106, and more particularly separates the silicon fin-forming layer 108 and the silicon substrate layer 102. This is further illustrated at the cross-section taken along the Y-axis, illustrating the open space 702. In this way, a source/drain material can be grown and/or deposited directly beneath a full lateral extent (e.g., along the X2 axis) of each fin/channel. Again, as noted above, fin collapse is prevented due to the support from the longitudinally adjacent (e.g., along the Y-axis) cut regions 103*a* (such as along the X1-axis.

Figure 8:
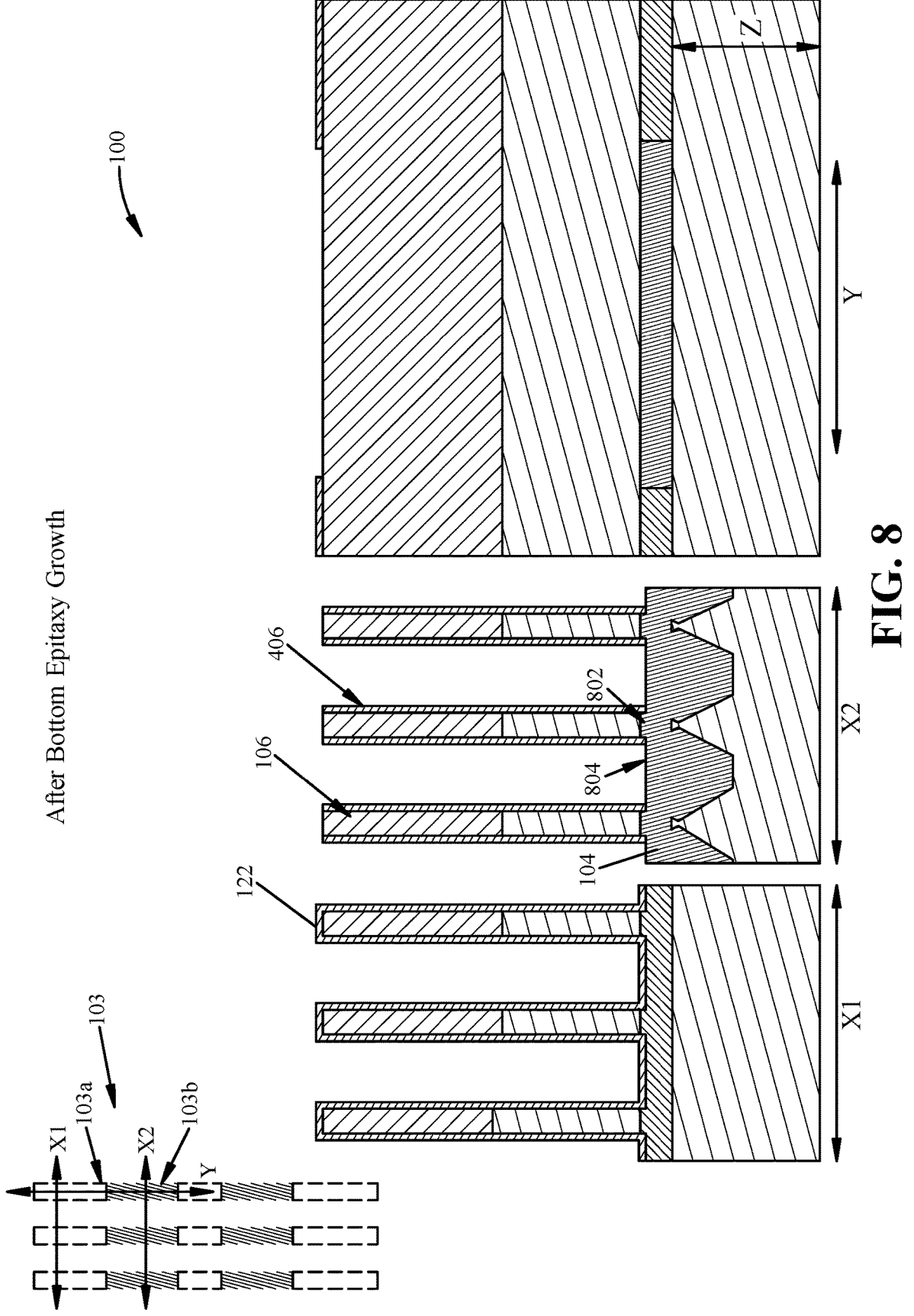
FIG. 8 illustrates a schematic diagram of another fabrication step for the electronic structure of FIG. 1, illustrating epaxial material formation, in accordance with one or more embodiments described herein.

Next, at FIG. 8, the OPL 124 is removed and an epitaxial material 130 is grown in the full space 702 formed along the Z-axis between the fins 106 and the silicon substrate layer 102. As illustrated, the epitaxial material 130 fills the valleys 502 and can extend at least partially into regions 802 formed between liner deposit sidewall portions (e.g., having the side surfaces 406) of each fin 106, thus extending above a major surface 704 of the epitaxial material 130, and thus forming the source/drain region 104.

As an advantage of at least the one or more steps illustrated at FIG. 8, the epitaxial material of the source/drain region 104 can serve as a source/drain region for the fins 106, providing for a direct and resistance-reduced path for electric signals (e.g., current) along the fins 106 and between the epitaxial material of the source/drain region 104 and another source/drain region (now shown), as compared to existing VTFET frameworks.

Figure 9:
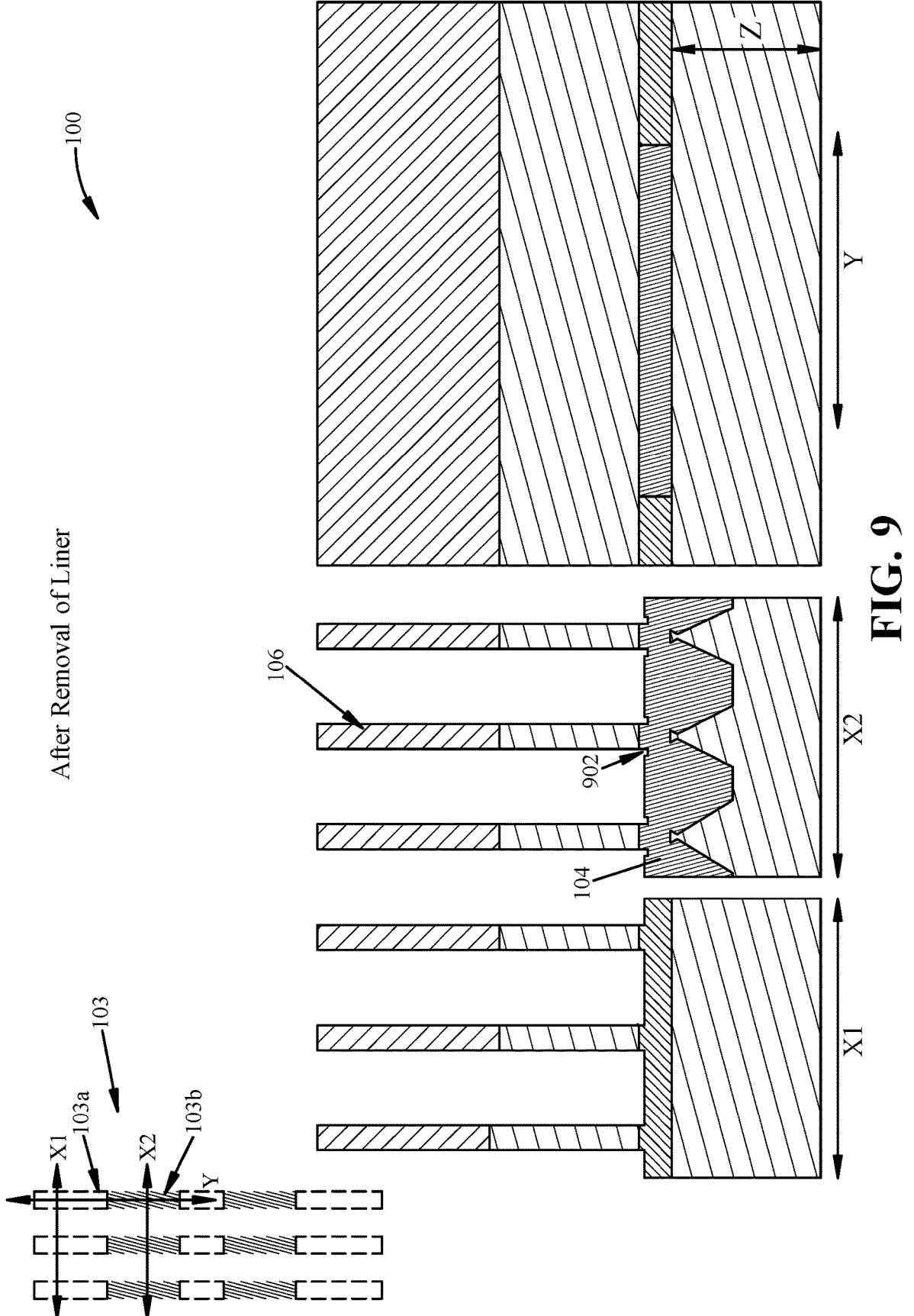
FIG. 9 illustrates a schematic diagram of another fabrication step for the electronic structure of FIG. 1, in accordance with one or more embodiments described herein.

At FIG. 9, the liner layer 122, which at least partially served to prevent epitaxy growth on side walls of the fins 106, can be removed by any suitable method. As a result, a portion of the epitaxial material directly laterally adjacent (e.g., along the X2-axis) to sidewalls of the fins 106 can be partially removed. This can form depressions 902 as illustrated. These depressions 902 are exaggerated at FIG. 9 and subsequent FIGS. for case of reference. In actual fabrication, it can be difficult to exactly limit layer removal to an exact height along the Z-axis.

In addition, the liner layer 122 at the fins 106 of the cut regions 103*a* also can be removed, leaving additional respective depressions.

Figure 10:
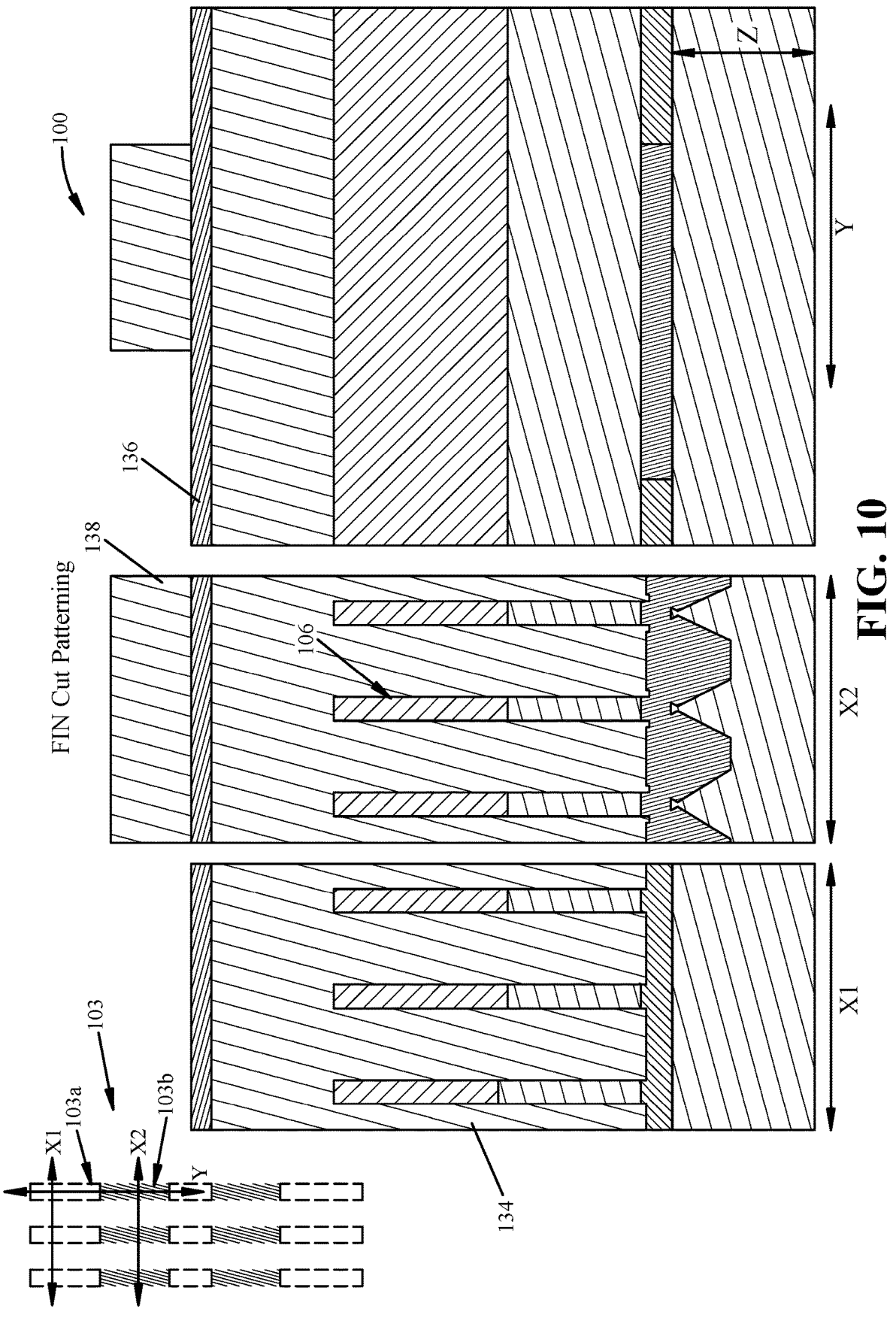
FIG. 10 illustrates a schematic diagram of a fin cut patterning step for the electronic structure of FIG. 1, in accordance with one or more embodiments described herein.

At FIG. 10, three layers of a tri-layer system can be deposited for fin cut patterning. The three layers of the tri-layer lithography system can be another OPL 134, a silicon based anti-reflection coat layer (e.g., SiARC layer 136) and a photo-resist layer 138. While the additional OPL 134 and the SiARC layer 136 are applied to the entire assembly 103, the photo-resist layer 138 is applied only to the fin regions 103*b* that are not to be ultimately cut away.

Figure 11:
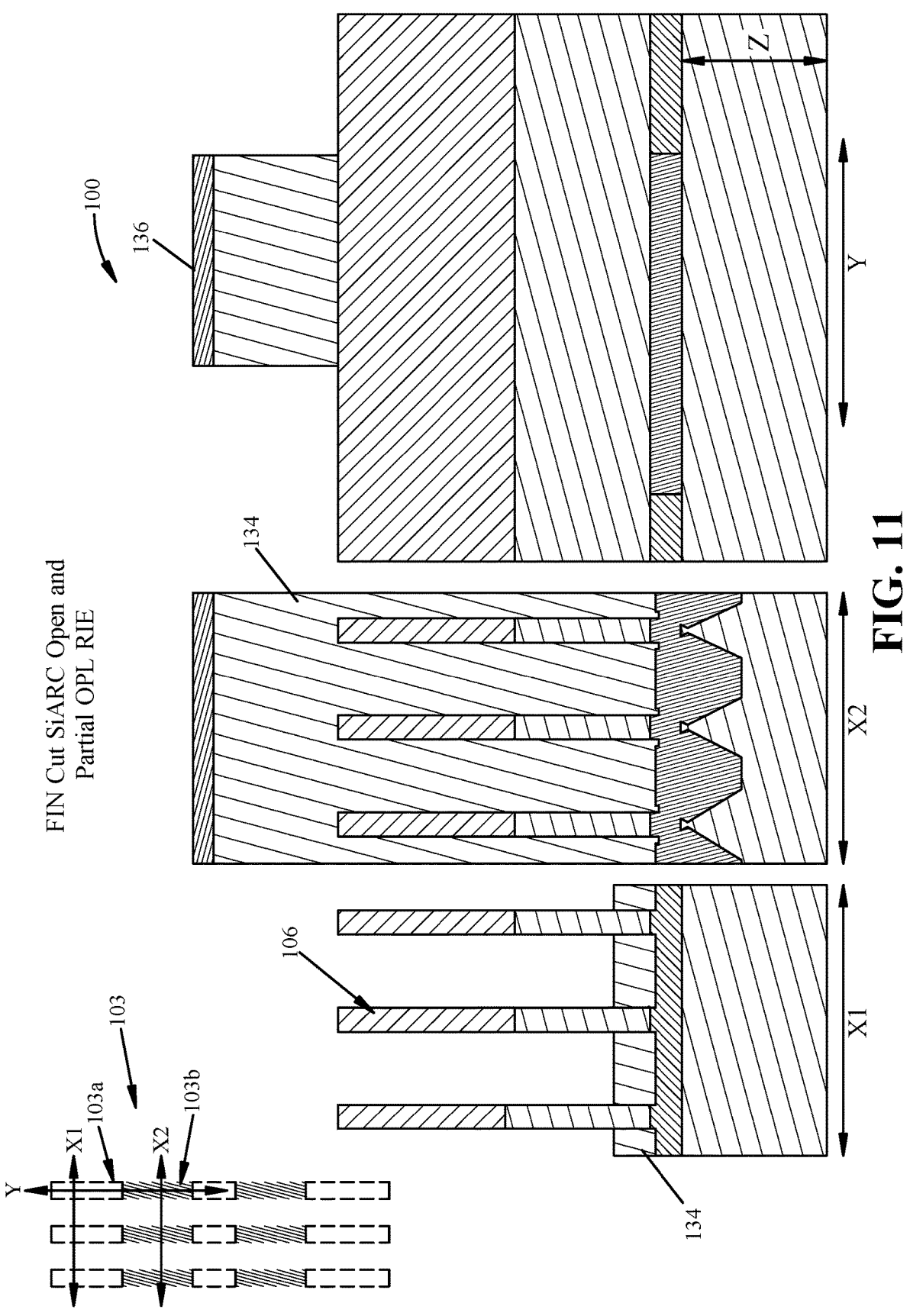
FIG. 11 illustrates a schematic diagram of another fabrication step for the electronic structure of FIG. 1, in accordance with one or more embodiments described herein.

Next, at FIG. 11, the SiARC layer 136 is opened by removing the photo-resist layer 138, such as by RIE. In addition, a portion of the OPL 134 is removed, such as by RIE. The removed portion is disposed at the cut regions 103*a* that is to be finally cut away. The OPL 134 at the fin region 103*b* remains undisturbed at this step.

Figure 12:
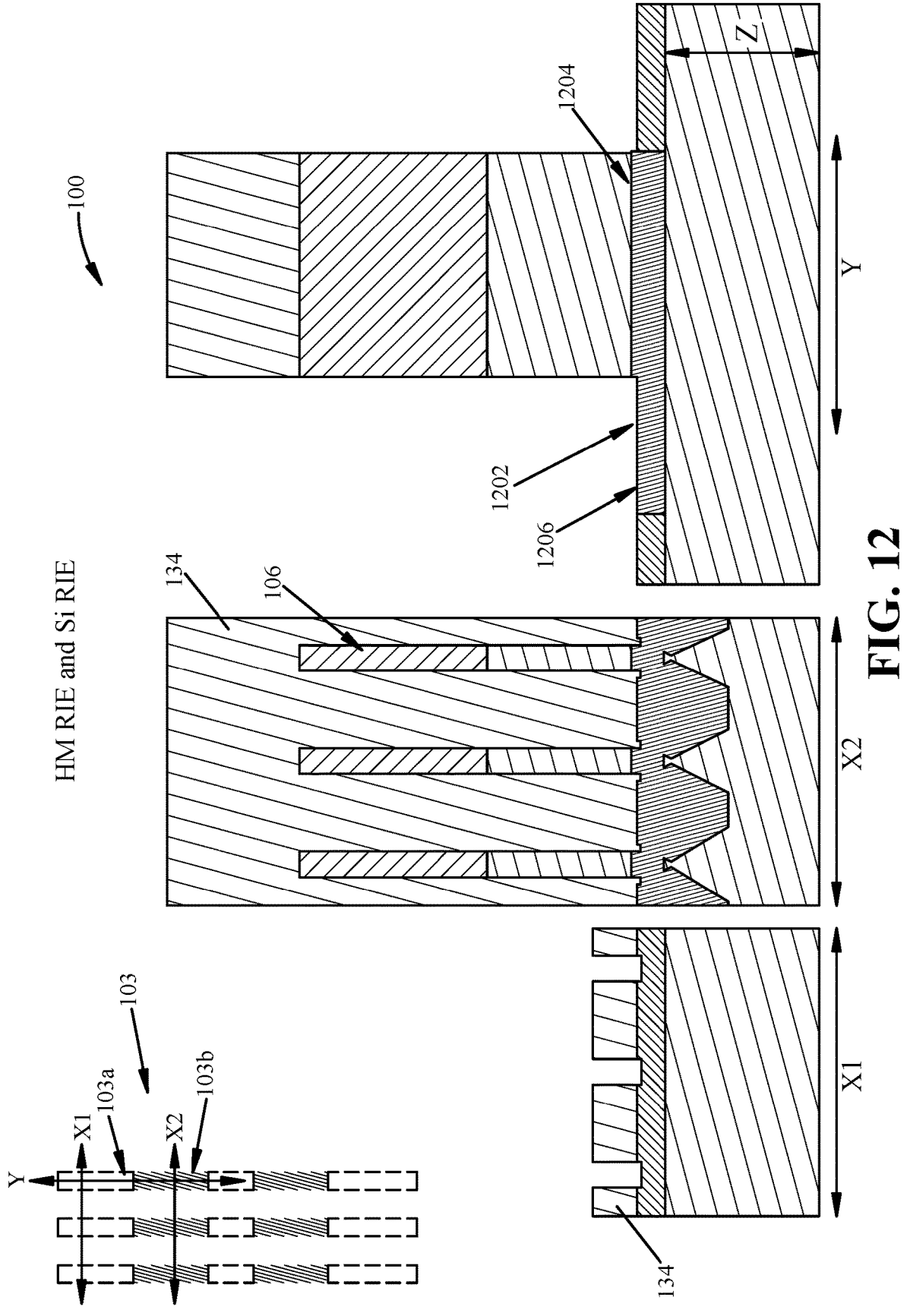
FIG. 12 illustrates a schematic diagram of another fabrication step for the electronic structure of FIG. 1, in accordance with one or more embodiments described herein.

At FIG. 12, the hard mask layer 110 and the silicon fin-forming layer 108 of the fins 106 at the cut region 103*a* are removed, such as by RIE and/or atomic layer etching (ALE). As a result, all fins at the cut regions 103*a* are removed after the one or more steps of FIG. 12. As an additional result, as shown at the portion of the assembly 103 along the Y-axis, over-etching of the epitaxial material of the source/drain region 104 at the cut regions 103*a* can be minimized (e.g., at location 1202). As a result, the epitaxial material of the source/drain region 104 has a first surface height 1204 directly along the extension direction of the fins 106 and a second and lower surface height 1206 laterally adjacent (e.g., along the X axes) the fins 106. Such extension direction is generally along respective longitudinal axes of the fins 106, such as along the central longitudinal axes 604 of the fins 106. The difference in the surface heights 1204 and 1206 is an artifact of the inventive method steps discussed herein. That is, the surface height difference of surface heights 1204 and 1206 can be proof that a fin-cut-last process is utilized. Indeed, one or more, such as all, final fin cuts (e.g., to remove cut regions 103*a*) cannot be performed prior to growth of epitaxial material of the source/drain region 104 in that at least one cut region 103*a* can be a supporting structure for an adjacent fin region 103*b* prior to epitaxial material growth. See, e.g., FIG. 7 and the space 702, showing fins 106 of the fin region 103*b* being supported by the cut region 103*a*.

At FIG. 13, a lithography step is performed to remove the OPL 134 and to pattern the resultant assembly 103 for shallow trench isolation (STI) formation. That is, at both the cut regions 103*a* and the fin regions 103*b*, source/drain region 104, sacrificial semiconductor layer 120 and/or silicon substrate layer 102 material is removed to allow for subsequent formation of STI's 112 in the removal locations. The material removal areas are labeled as spaces 1302.

It is noted that a excess section 150 of the sacrificial semiconductor layer 120 remains after the lithography step, at the fin region 103*b*. That is, the spaces 1302 are formed, with the respective materials being removed, in a manner that maintains distance between the material removal and the fins 106 of the fin region 103*b* such as to not damage the fins, channels and/or source/drain region 104 beneath the fins (e.g., beneath along the vertical Z-axis along the extension direction of the fins). Such extension direction is generally along respective longitudinal axes of the fins 106, such as along the central longitudinal axes 604 of the fins 106. This remaining excess section 150 is an artifact of the inventive method steps discussed herein.

At FIG. 14, the STI's 112 can be formed in the spaces 1302. These STI's 112 can provide electric signal breaks between fin channels during use of the resultant electronic structure 100. An STI region 112 can comprise a dielectric, such as an annealed oxide. Formation of the STI regions 112 can comprise overfilling the spaces 1302 with STI material and employing chemical mechanical planarization (CMP) and RIE to one or more exposed surfaces of the STI region 112.

In summary, the illustrated resultant electronic structure 100 can comprise a substrate layer 102, a fin 106 extending outwardly from the substrate layer 102, a source/drain region 104 having a first portion 101 disposed between the substrate layer 102 and the fin 106 and stacked with the fin 106 and the substrate layer 102 along a common extension direction (along 604) of the fin 106, and an excess section 150 of semiconductor material of the original sacrificial semiconductor layer 120 disposed adjacent the first portion 101 of the source/drain region 104 and positioned other than stacked together with the substrate layer 102 and the fin 106, wherein the semiconductor material 120 of the excess section 150 is different from a material of the fin 106 and different from a material of the source/drain region 104. The excess section 150 is disposed between a shallow trench isolation (STI) region 112 and the first portion 101 of the source/drain region 104. The excess section of semiconductor material 120 comprises a silicon-based material such as silicon-germanium.

Further, the source/drain region has multiple surface heights 1206 and 1204 facing the fin 106.

A third portion 101 of the source/drain region 104 is disposed directly between the substrate layer 102 and a second fin 106. The source/drain region 104 extends continuously from the first portion 101 to the third portion 101 along a second portion 107 disposed between the first portion 101 and third portion 101.

Put another way, the resultant electronic structure 100 can comprise a substrate layer 102, a fin 106 extending outwardly from the substrate layer 102 and having a fin surface 1402 facing towards the substrate layer 102. A source/drain region 104 has a first portion 101 disposed between the substrate layer 102 and the fin 106. The first portion 101 is stacked together with the substrate layer 102 and the fin 106 along an extension direction (along 604) of the fin 106. The first portion 101 has a first surface 1404 facing towards the fin surface 1402. In one or more embodiments this can comprise the surfaces 1402 and 1404 engaging one another.

The source/drain region 104 has a second portion 107 disposed adjacent to the first portion 101 and positioned other than stacked together with the substrate layer 102 and the fin 106. The second portion 107 has a second surface 1406 facing towards the fin surface 1402. A first distance along the extension direction of the fin 106 between the fin surface 1402 and the first surface 1404 is less than a second distance along the extension direction of the fin 106 between the fin surface 1402 and the second surface 1406.

The substrate layer 102 has a first section 1410 stacked with the fin 106 and the first portion 101 of the source/drain region 104 along the extension direction of the fin 106, wherein the first section 1410 has a third surface 1412 facing towards the fin surface 1402, and wherein the substrate layer 102 has a second section 1414 disposed adjacent to the first section 1410 and stacked together with the second portion 107 of the source/drain region 104 along the extension direction of the fin 106. The second section 1414 has a fourth surface 1416 facing towards the fin surface 1402, wherein a third distance along the extension direction of the fin 106 between the fin surface 1402 and the third surface 1412 is less than a fourth distance along the extension direction of the fin 106 between the fin surface 1402 and the fourth surface 1416.

The substrate layer 102 has a first section 1410 stacked together with the fin 106 and the first portion 101 of the source/drain region 104 along the extension direction of the fin 106, wherein the first section 1410 has a third surface 1412 facing towards the fin surface 1402, wherein the third surface 1412 of the first section 1410 has a width in a width direction, transverse to the extension direction of the fin 106, and that is bounded on opposite sides by the source/drain region 104, and wherein the width is less than or equal to a width of the fin surface 1402.

The second surface 1406 of the second portion 107 of the source/drain region 104 has an adjacent surface section (at the depression 902) and a proximate surface section (at the arrow of element indicator for the second surface 1406) disposed adjacent to one another, and wherein a fifth distance along the extension direction of the fin 106 between the fin surface 1402 and the adjacent surface section (at the depression 902) is greater than a sixth distance along the extension direction of the fin 106 between the fin surface 1402 and the proximate surface section (at the arrow of element indicator for the second surface 1406).

An advantage of the aforementioned steps can be an ability to provide a fin and epitaxial material with more efficient respective profiles. Indeed, a resultant VTFET can allow current flow from one source/drain region to another source/drain region in a shortest path directly along a fin of a VTFET, which can therefor provide lower resistance for the current flow. This can be at least because one epitaxial source/drain region can be formed directly underneath a channel of the VTFET.

Figure 15:
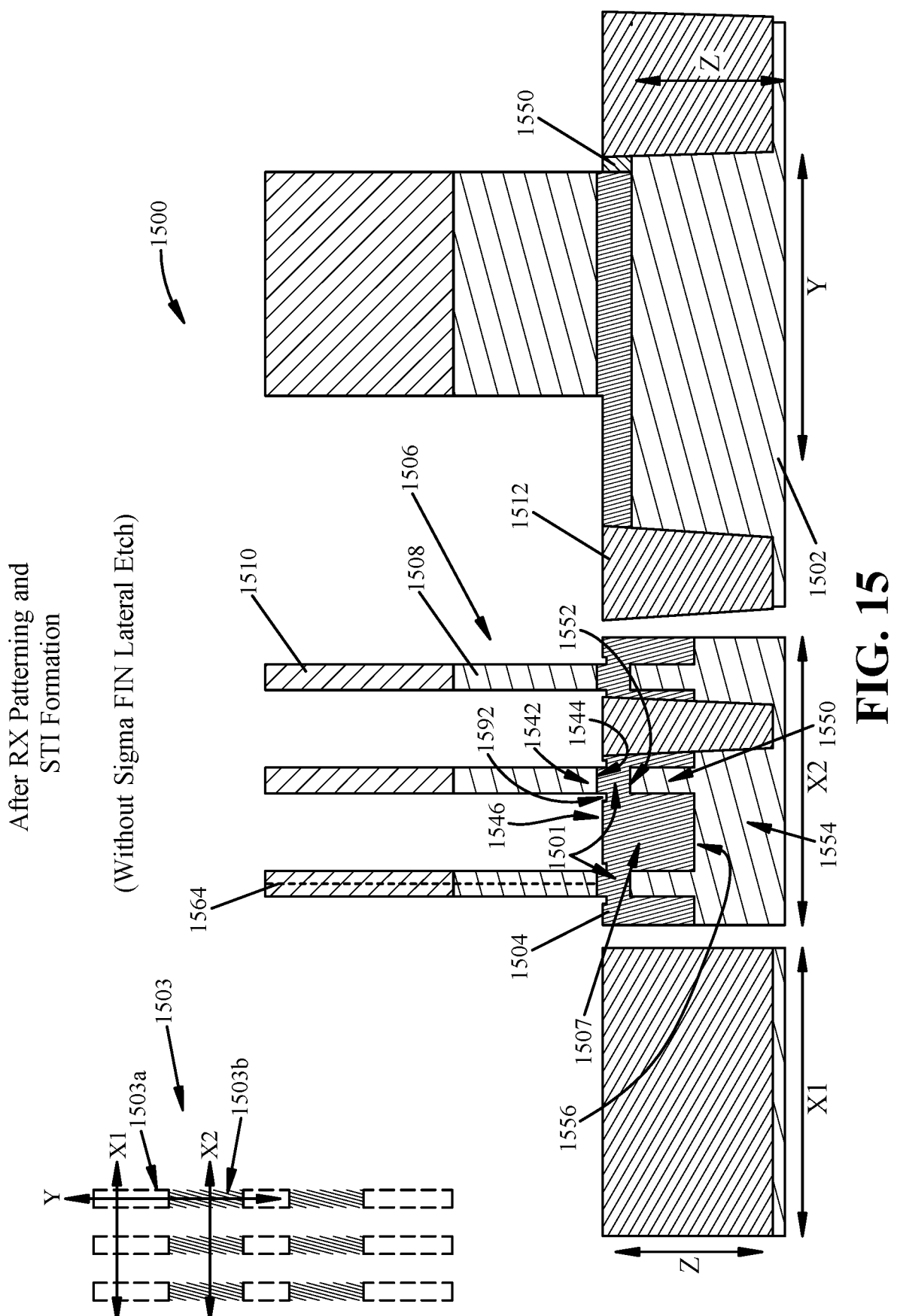
FIG. 15 illustrates a schematic diagram of a second electronic structure, in accordance with one or more embodiments described herein.

Turning next generally to FIG. 15, another embodiment of an electronic structure, a semiconductor device, and indeed a VTFET, is illustrated at 1500. As will be described, the electronic structure 1500 provides less resistance for signal travel across fin channels than existing VTFET structures. Aspects of the electronic structure 1500 are numbered similarly to aspects of the electronic structure 100 but increased by 1400. Accordingly, description of similarly corresponding aspects of the electronic structure 100 can apply to the electronic structure 1500.

Generally, the electronic structure 1500 comprises a fin 1506 comprising a fin-forming layer 1508 of semiconductor material (e.g., Si), a hard mask layer 1510 that can be removed, a source/drain region 1504 of epitaxial material, a substrate layer 1502 of semiconductor material (e.g., Si), a shallow trench isolation (STI) region 1512 and an excess section 1550 of undoped semiconductor material (e.g., SiGe). The source/drain region 1504 has varying surface heights including a first height directly beneath the fin-forming layer 1508 and a second and lower height adjacent the fins 1506. The fin-forming layer 1508 and the substrate layer 1502 can be comprised of the same material or of different materials.

Although the fin-forming layer 1508 is shown in the figures as having a same material as the substrate layer 1502, in one or more embodiments, the fin-forming layer 1508 can have a different material composition than the substrate layer 1502.

Steps of FIGS. 2 to 5 and 7 to 13 are generally applicable to fabrication of the resultant electronic structure 1500 from the assembly 1503. However, the sigma fin lateral etch step of FIG. 6 is not applied to the assembly 1503 (comprising cut regions 1503a and fin regions 1503b) to form the resultant electronic structure 1500. That is, as illustrated at FIG. 15, there is no lateral etching at walls forming sides of valleys of the substrate layer 1502. Accordingly, a third surface 1552 of the substrate layer 1502 generally has a width (e.g., in a lateral direction of the X2-axis between opposing portion of epitaxial material of the source/drain region 1504) that is equal to a corresponding width of the surface 1542 of the fin 1506. Accordingly, reduced space is provided for reduced growth of epitaxial material of the source/drain region 1504 directly beneath the fins 106 and corresponding channels. Nonetheless, the epitaxial material of the source/drain region 1504 can extend continuously across the X2-axis between plural channels.

In summary, the illustrated resultant electronic structure 1500 can comprise a substrate layer 1502, a fin 1506 extending outwardly from the substrate layer 1502, a source/drain region 1504 having a first portion 1501 disposed between the substrate layer 1502 and the fin 1506 and stacked with the fin 1506 and the substrate layer 1502 along a common extension direction (along 1564) of the fin 1506, and an excess section 1550 of semiconductor material of an initial sacrificial semiconductor layer 1520 disposed adjacent the first portion 1501 of the source/drain region 1504 and positioned other than stacked together with the substrate layer 1502 and the fin 1506, wherein the semiconductor material 1520 of the excess section 1550 is different from a material of the fin 1506 and different from a material of the source/drain region 1504. The excess section 1550 is disposed between a shallow trench isolation (STI) region 1512 and the first portion 1501 of the source/drain region 1504. The excess section of semiconductor material 1520 comprises a silicon-based material such as silicon-germanium.

Further, the source/drain region has multiple surface heights 1546 and 1544 facing the fin 106.

A third portion 1501 of the source/drain region 1504 is disposed directly between the substrate layer 1502 and a second fin 1506. The source/drain region 1504 extends continuously from the first portion 1501 to the third portion 1501 along a second portion 1507 disposed between the first portion 1501 and third portion 1501.

Put another way, the resultant electronic structure 1500 can comprise a substrate layer 1502, a fin 1506 extending outwardly from the substrate layer 1502 and having a fin surface 1542 facing towards the substrate layer 1502. A source/drain region 1504 has a first portion 1501 disposed between the substrate layer 1502 and the fin 1506. The first portion 1501 is stacked together with the substrate layer 1502 and the fin 1506 along an extension direction (along 1564) of the fin 1506. The first portion 1501 has a first surface 1544 facing towards the fin surface 1542. In one or more embodiments this can comprise the surfaces 1542 and 1544 engaging one another.

The source/drain region 1504 has a second portion 1507 disposed adjacent to the first portion 1501 and positioned other than stacked together with the substrate layer 1502 and the fin 1506. The second portion 1507 has a second surface 1546 facing towards the fin surface 1542. A first distance along the extension direction of the fin 1506 between the fin surface 1542 and the first surface 1544 is less than a second distance along the extension direction of the fin 1506 between the fin surface 1542 and the second surface 1546.

The substrate layer 1502 has a first section 1551 stacked with the fin 1506 and the first portion 1501 of the source/drain region 1504 along the extension direction of the fin 1506, wherein the first section 1551 has the third surface 1552 facing towards the fin surface 1542, and wherein the substrate layer 1502 has a second section 1554 disposed adjacent to the first section 1551 and stacked together with the second portion 1507 of the source/drain region 1504 along the extension direction of the fin 1506. The second section 1554 has a fourth surface 1556 facing towards the fin surface 1542, wherein a third distance along the extension direction of the fin 1506 between the fin surface 1542 and the third surface 1552 is less than a fourth distance along the extension direction of the fin 1506 between the fin surface 1542 and the fourth surface 1556.

The substrate layer 1502 has a first section 1551 stacked together with the fin 1506 and the first portion 1501 of the source/drain region 1504 along the extension direction of the fin 1506, wherein the first section 1551 has a third surface 1552 facing towards the fin surface 1542, wherein the third surface 1552 of the first section 1551 has a width in a width direction, transverse to the extension direction of the fin 1506, and that is bounded on opposite sides by the source/drain region 1504, and wherein the width is less than or equal to a width of the fin surface 1542.

The second surface 1546 of the second portion 1507 of the source drain region 1504 has an adjacent surface section (at the depression 1592) and a proximate surface section (at the arrow of element indicator 1546) disposed adjacent to one another, and wherein a fifth distance along the extension direction of the fin 1506 between the fin surface 1542 and the adjacent surface section (at the depression 1592) is greater than a sixth distance along the extension direction of the fin 1506 between the fin surface 1542 and the proximate surface section (at the arrow of element indicator 1546).

An advantage of the aforementioned steps can be an ability to provide a fin and epitaxial material with more efficient respective profiles. Indeed, a resultant VTFET can allow current flow from one source/drain region to another source/drain region in a shortest path directly along a fin of a VTFET, which can therefor provide lower resistance for the current flow. This can be at least because one epitaxial source/drain region can be formed directly underneath a channel of the VTFET.

Figure 16:
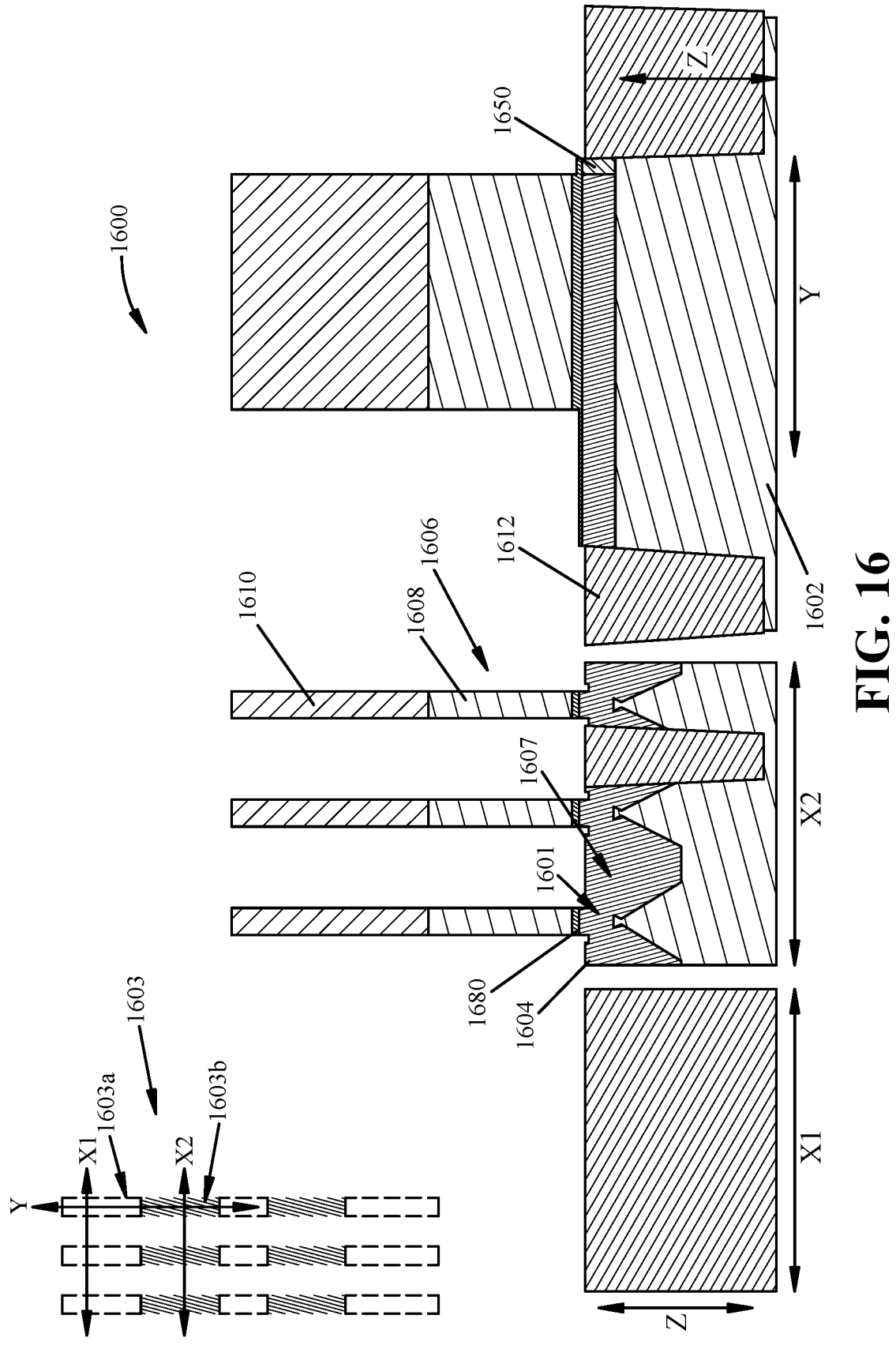
FIG. 16 illustrates a schematic diagram of a third electronic structure, in accordance with one or more embodiments described herein.

Turning next generally to FIG. 16, still another embodiment of an electronic structure, a semiconductor device, and indeed a VTFET, is illustrated at 1600. As will be described, the electronic structure 1600 provides less resistance for signal travel across fin channels than existing VTFET structures. Aspects of the electronic structure 1600 are numbered similarly to aspects of the electronic structure 100 but increased by 1500. Accordingly, description of similarly corresponding aspects of the electronic structure 100 can apply to the electronic structure 1600.

Generally, the electronic structure 1600 comprises a fin 1606 comprising semiconductor material at a fin-forming layer 1608 (e.g., Si), a hard mask layer 1610 that can be removed, a source/drain region 1604 of epitaxial material, a substrate layer 1602 of semiconductor material (e.g., Si), a shallow trench isolation (STI) region 1612 and an excess section 1650 of undoped semiconductor material (e.g., SiGe). The source/drain region 1604 has varying surface heights including a first height directly beneath the fin-forming layer 1608 and a second and lower height adjacent the fins 1606. The fin-forming layer 1608 and the substrate layer 1602 can be comprised of the same material or of different materials.

Further, as illustrated at FIG. 16, and different from the electronic structures 100 and 1500, a dopant-resistant barrier layer 1680 is disposed along the extension direction of the fins 1606 (e.g., along the Z-axis) between the fin-forming semiconductor material 1608 and the epitaxial material of the source/drain region 1604. This dopant-resistant barrier layer 1680 can be deposited to restrict and/or prevent dopant diffusion from the epitaxial material of the source/drain region 1604 to the fin-forming semiconductor material 1608. The dopant-resistant barrier layer 1680 can be comprised of silicon carbide (SiC) or other suitable material.

For example, in one or more steps of fabrication of the electronic structures 100, 1500 and/or 1600, the epitaxial material of the source/drain layer 1604 can be doped to improve conductivity. Such dopant can diffuse to an adjacent area, such as the fin-forming semiconductor material 1608 (e.g., Si) of the channel. This can be undesirable. The dopant-resistant barrier layer 1680 can limit and/or fully restrict such dopant diffusion.

That is, steps of FIGS. 2 to 13 are generally applicable to fabrication of the resultant electronic structure 1600 from the assembly 1603. However, these steps further include deposition and subsequent partial cutting and partial etching of the respective dopant-resistant barrier layer 1680. For exemplary purposes, FIGS. 17-20 illustrate a select portion of the steps of FIGS. 2 to 13 but instead FIGS. 17-20 are directly applicable to fabrication of the resultant electronic structure 1600 from the assembly 1603.

Figure 17:
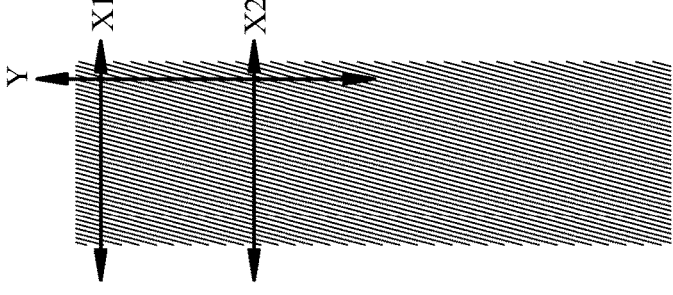
FIG. 17 illustrates a schematic diagram of another fabrication step for the electronic structure of FIG. 16, in accordance with one or more embodiments described herein.

At FIG. 17, an initial stacking step can be performed by placing and/or depositing layers atop a substrate, such as a silicon substrate layer 102. An undoped and sacrificial semiconductor layer 1620 (e.g., silicon-germanium or SiGe) can be deposited on top of the substrate layer 1602, the dopant-resistant barrier layer 1680 can then be deposited on top of the sacrificial semiconductor layer 1620, a silicon fin-forming layer 108 on top of the dopant-resistant barrier layer 1680, and a hard mask layer 1610 on top of the silicon fin-forming layer 1608. Although the fin-forming layer 1608 is shown in the figures as having a same material as the substrate layer 1602, in one or more embodiments, the fin-forming layer 1608 can have a different material composition than the substrate layer 1602.

Figure 18:
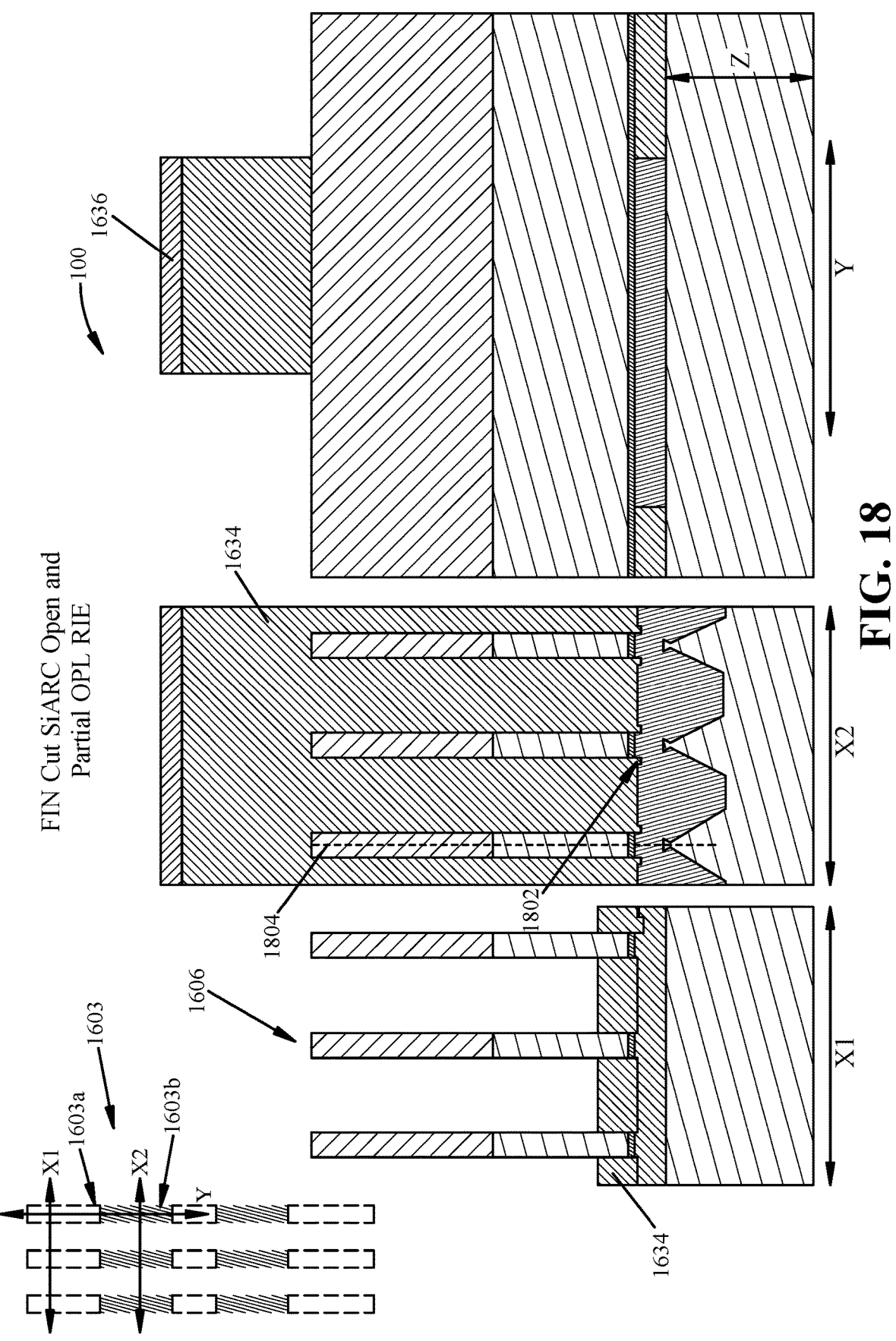
FIG. 18 illustrates a schematic diagram of another fabrication step for the electronic structure of FIG. 16, in accordance with one or more embodiments described herein.

Between FIGS. 17 and 18, the steps of fin RIE, liner deposition, EW patterning and RIE, sigma fin lateral etch, SiGe isotropic indentation, bottom epitaxy growth, liner removal (e.g., forming the depressions 1802), and fin cut patterning can be performed.

At FIG. 18, the SiARC layer 1636 is opened by removing the photo-resist layer (not shown), such as by RIE. In addition, a portion of the OPL 1634 is removed, such as by RIE. The removed portion is disposed at the cut region 1603*a* that is to be finally cut away. The OPL 1634 at the fin region 1603*b* remains undisturbed at this step.

Figure 19:
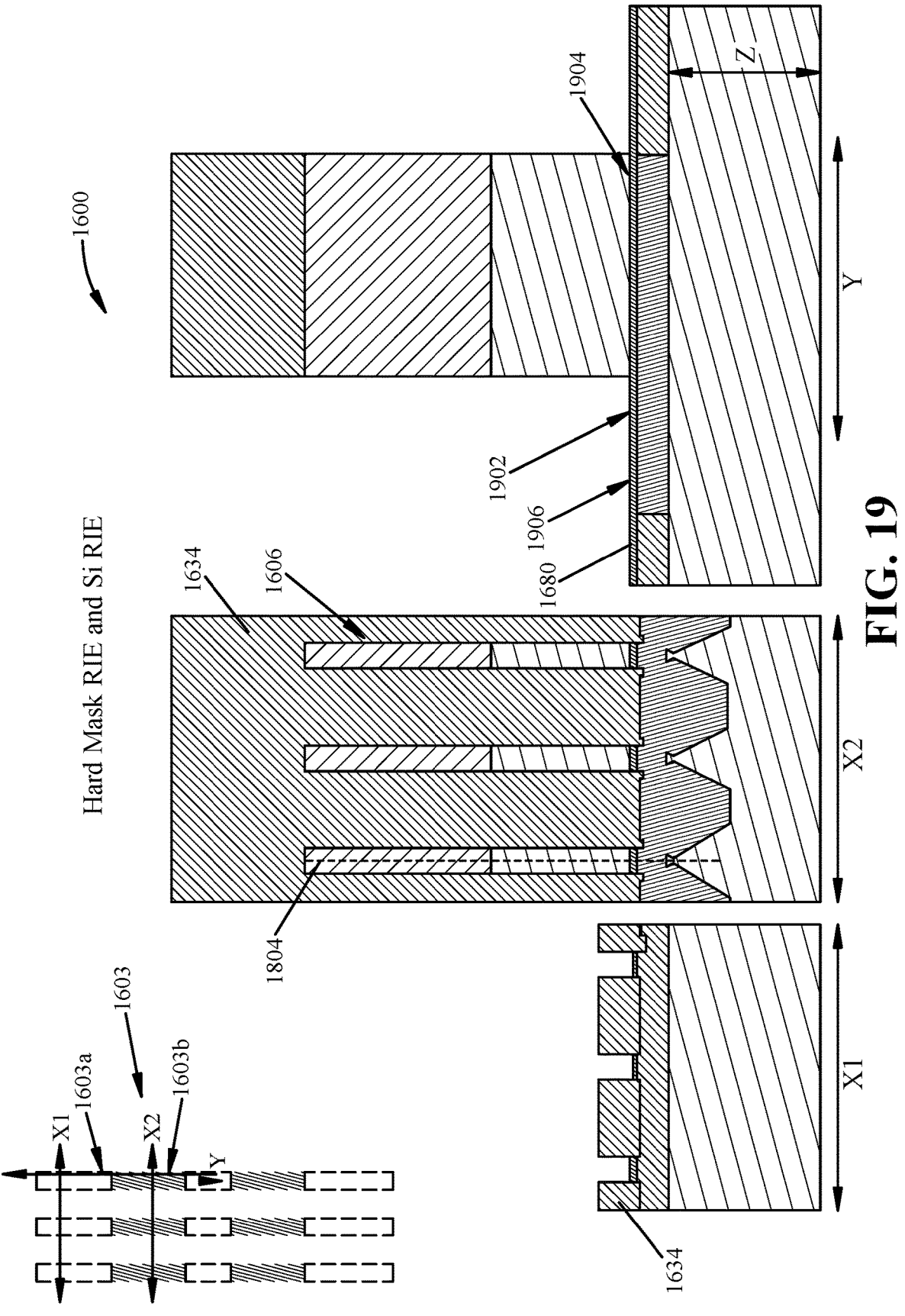
FIG. 19 illustrates a schematic diagram of another fabrication step for the electronic structure of FIG. 16, in accordance with one or more embodiments described herein.

Next, at FIG. 19, the hard mask layer 1610 and the silicon fin-forming layer 1608 of the fins 1606 at the cut region 1603*a* are removed, such as by RIE and/or atomic layer etching (ALE). As a result, all fins at the cut regions 1603*a* are removed after the one or more steps of FIG. 19. As an additional result, as shown at the portion of the assembly 1603 along the Y-axis, over-etching of the dopant-resistant barrier layer 1680 at the cut regions 1603*a* can be minimized (e.g., at location 1902). As a result, the dopant-resistant barrier layer 1680 has a first surface height 1904 directly along the extension direction of the fins 1606 and a second and lower surface height 1906 laterally adjacent (e.g., along the X axes) the fins 1606. Such extension direction is generally along respective longitudinal axes of the fins 1606, such as along the central longitudinal axes 1804 of the fins 1606. The difference in the surface heights 1904 and 1906 is an artifact of the inventive method steps discussed herein.

That is, the dopant-resistant barrier layer 1680 is deposited prior to the final (late) fin cut to remove sections, such as the cut sections 1603*a*. Accordingly, the surface height difference of surface heights 1904 and 1906 can be proof that a fin-cut-last process is utilized. Indeed, one or more, such as all, final fin cuts (e.g., to remove cut regions 1603*a*) cannot be performed prior to growth of epitaxial material of the source/drain region 1604 in that at least one cut region 1603*a* can be a supporting structure for an adjacent fin region 1603*b* prior to epitaxial material growth. See, e.g., FIG. 7 and the space 702, showing fins 106 of the fin region 103*b* being supported by the cut region 103*a*.

Figure 20:
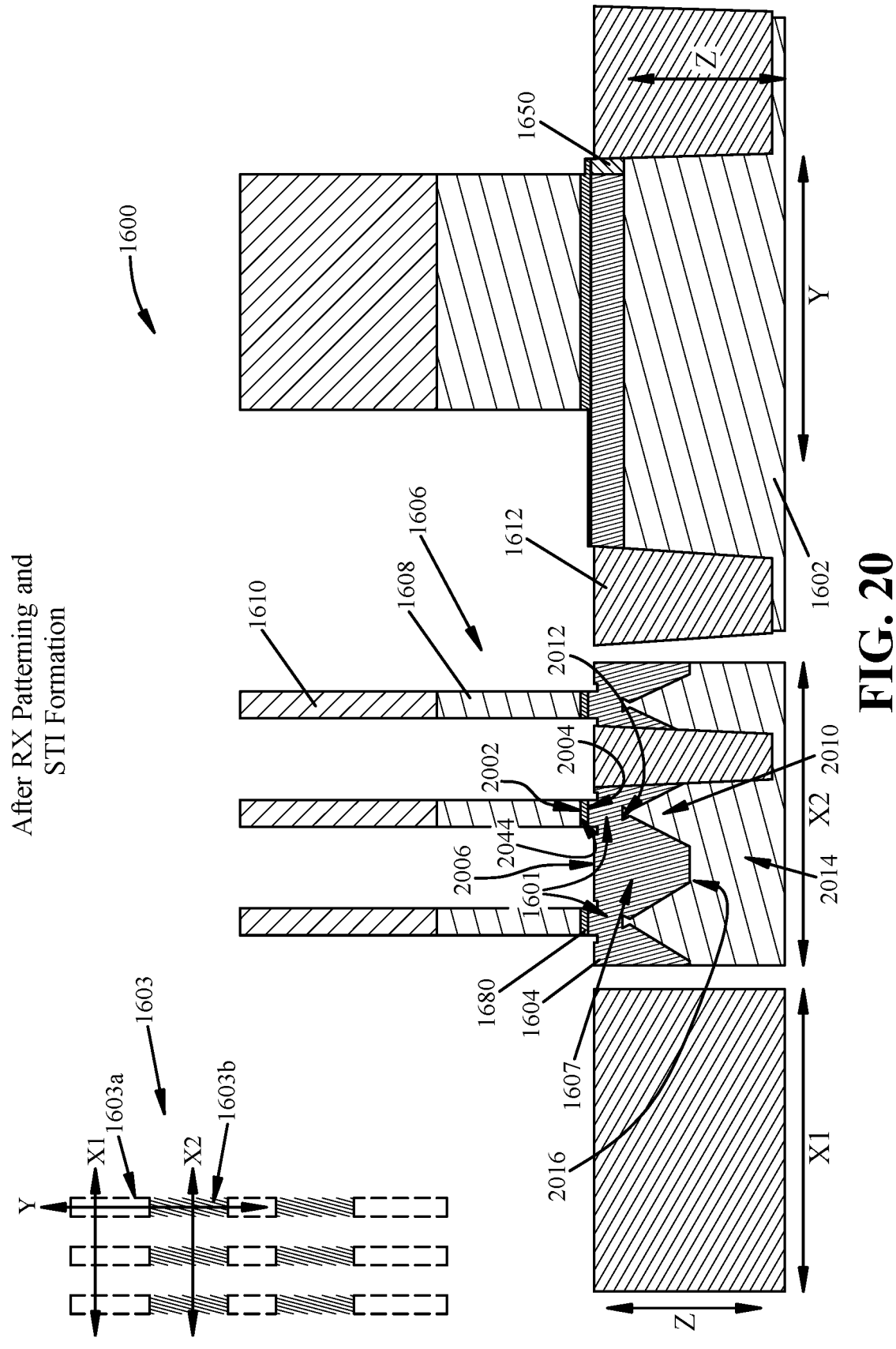
FIG. 20 illustrates again the resultant schematic diagram of the first electronic structure of FIG. 16, in accordance with one or more embodiments described herein.

Turning next to FIG. 20, after the one or more steps of FIG. 19, a lithography step is performed to remove the OPL 1634 and to pattern the resultant assembly 1603 for shallow trench isolation (STI) formation. That is, at both the cut regions 1603*a* and the fin regions 1603*b*, epitaxial material of the source/drain region 1604, sacrificial semiconductor layer 1620, dopant-resistant barrier layer 1680 and/or silicon substrate layer 1602 material is removed to allow for subsequent formation of STI's 1612 in the removal locations. These STI's 1612 can provide electric signal breaks between fin channels during use of the resultant electronic structure 1600.

It is noted that an excess section 1650 of the sacrificial semiconductor layer 1620 remains after the lithography step, at the fin region 1603*b*. That is, spaces for STI formation are formed, with the respective materials being removed, in a manner that maintains distance between the material removal and the fins 1606 of the fin region 1063*b* such as to not damage the fins, channels and/or epitaxial material of the source/drain region 1604 beneath the fins (e.g., beneath along the vertical Z-axis along the extension direction of the fins). This excess section 1650 is an artifact of the inventive method steps discussed herein.

In summary, the illustrated resultant electronic structure 1600 can comprise a substrate layer 1602, a fin 1606 extending outwardly from the substrate layer 1602, a source/drain region 1604 having a first portion 1601 disposed between the substrate layer 1602 and the fin 1606 and stacked with the fin 1606 and the substrate layer 1602 along a common extension direction (along 1804) of the fin 1606, and an excess section 1650 of semiconductor material of the initial sacrificial semiconductor layer 1620 disposed adjacent the first portion 1601 of the source/drain region 1604 and positioned other than stacked together with the substrate layer 1602 and the fin 1606, wherein the semiconductor material of the excess section 1650 is different from a material of the fin 106 and different from a material of the source/drain region 1604. The excess section 1650 is disposed between a shallow trench isolation (STI) region 1612 and the first portion 1601 of the source/drain region 1604. The excess section 1650 of semiconductor material comprises silicon-germanium.

A third portion 1601 of the source/drain region 1604 is disposed directly between the substrate layer 1602 and a second fin 1606. The source/drain region 1604 extends continuously from the first portion 1601 to the third portion 1601 along a second portion 1607 disposed between the first portion 1601 and third portion 1601.

Put another way, the resultant electronic structure 1600 can comprise a substrate layer 1602, a fin 1606 extending outwardly from the substrate layer 1602 and having a fin surface 2002 facing towards the substrate layer 1602. A source/drain region 1604 has a first portion 1601 disposed between the substrate layer 1602 and the fin 1606. The first portion 1601 is stacked together with the substrate layer 1602 and the fin 1606 along an extension direction (along 1804) of the fin 1606. The first portion 1601 has a first surface 2004 facing towards the fin surface 2002.

The source/drain region 1604 has a second portion 1607 disposed adjacent to the first portion 1601 and positioned other than stacked together with the substrate layer 1602 and the fin 1606. The second portion 1607 has a second surface 2006 facing towards the fin surface 2002. A first distance along the extension direction of the fin 1606 between the fin surface 2002 and the first surface 2004 is less than a second distance along the extension direction of the fin 1606 between the fin surface 2002 and the second surface 2006.

The substrate layer 1602 has a first section 2010 stacked with the fin 1606 and the first portion 1601 of the source/drain region 1604 along the extension direction of the fin 1606, wherein the first section 2010 has a third surface 2012 facing towards the fin surface 2002, and wherein the substrate layer 1602 has a second section 2014 disposed adjacent to the first section 2010 and stacked together with the second portion 1607 of the source/drain region 1604 along the extension direction of the fin 1606. The second section 2014 has a fourth surface 2016 facing towards the fin surface 2002, wherein a third distance along the extension direction of the fin 1606 between the fin surface 2002 and the third surface 2012 is less than a fourth distance along the extension direction of the fin 1606 between the fin surface 2002 and the fourth surface 2016.

The substrate layer 1602 has a first section 2010 stacked together with the fin 1606 and the first portion 1601 of the source/drain region 1604 along the extension direction of the fin 1606, wherein the first section 2010 has a third surface 2012 facing towards the fin surface 2002, wherein the third surface 2012 of the first section 2010 has a width in a width direction, transverse to the extension direction of the fin 1606, and that is bounded on opposite sides by the source/drain region 1604, and wherein the width is less than or equal to a width of the fin surface 2002.

The second surface 2006 of the second portion 1607 of the source drain/region 1604 has an adjacent surface section (at the depression 1802) and a proximate surface section (at the arrow of element indicator of second surface 2006) disposed adjacent to one another, and wherein a fifth distance along the extension direction of the fin 1606 between the fin surface 2002 and the adjacent surface section (at the depression 1802) is greater than a sixth distance along the extension direction of the fin 1606 between the fin surface 2002 and the proximate surface section (at the arrow of element indicator of second surface 2006).

A dopant-resistant barrier layer 1680 is stacked together with and disposed between the fin 1606 and the source/drain region 1605 along the extension direction of the fin 1606. The dopant-resistant barrier layer 1680 can further extend along and cover the excess section 1650. Further, the dopant-resistant barrier layer 1680 has multiple surface heights 1906 and 1904 facing the fin 1606.

The dopant-resistant barrier layer 1680 has a barrier layer 2044 surface facing towards the fin surface 2002, wherein a seventh distance along the extension direction of the fin 1606 between the fin surface 2002 and the barrier layer surface 2044 is greater than the second distance (along the extension direction of the fin 1606 between the fin surface 2002 and the second surface 2006).

An advantage of the aforementioned steps can be an ability to provide a fin and epitaxial material with more efficient respective profiles. Indeed, a resultant VTFET can allow current flow from one source/drain region to another source/drain region in a shortest path directly along a fin of a VTFET, which can therefor provide lower resistance for the current flow. This can be at least because one epitaxial source/drain region can be formed directly underneath a channel of the VTFET.

Referring next to FIGS. 21 and 22, illustrated is a flow diagram of an example, non-limiting method 2100 that can provide a process to fabricate an electronic structure, such as the electronic structure 100, in accordance with one or more embodiments described herein. While the non-limiting method 2100 is described relative to the electronic structure 100 of FIG. 1, the non-limiting method 2100 can be applicable also to other systems described herein, such as any of the electronic structures 100, 1500 and/or 1600. Repetitive description of like elements and/or processes employed in respective embodiments is omitted for sake of brevity.

At 2101, the non-limiting method 2100 can comprise deposing, by a fabrication system (e.g., fabrication system 256), a plurality of layers in a stacked configuration to form a plurality of fins, wherein the plurality of layers comprise a sacrificial semiconductor layer stacked between a fin semiconductor layer and a substrate layer.

At 2102, the non-limiting method 2100 can comprise forming, by the fabrication system (e.g., fabrication system 256), fins of the plurality of fins aligned with one another along a substrate lateral direction along the substrate.

At 2104, the non-limiting method 2100 can comprise forming, by the fabrication system (e.g., fabrication system 256), at least one fin of the plurality of fins into a plurality of sub-fins aligned with one another along a substrate longitudinal direction, which is transverse to the substrate lateral direction, along the substrate.

At 2106, the non-limiting method 2100 can comprise depositing, by the fabrication system (e.g., fabrication system 256), a dielectric liner over the stacked configuration.

At 2108, the non-limiting method 2100 can comprise introducing, by the fabrication system (e.g., fabrication system 256), an organic planarization layer (OPL) to cover only portions of the plurality of fins and of the sacrificial semiconductor layer.

At 2110, the non-limiting method 2100 can comprise removing, by the fabrication system (e.g., fabrication system 256), portions of the dielectric liner, the substrate and the sacrificial semiconductor layer.

At 2112, the non-limiting method 2100 can comprise removing, by the fabrication system (e.g., fabrication system 256), the portions of the sacrificial semiconductor layer being only portions of the sacrificial semiconductor layer not covered by the OPL.

At 2114, the non-limiting method 2100 can comprise replacing, by the fabrication system (e.g., fabrication system 256), portions of the sacrificial semiconductor layer with a source/drain layer, wherein the source/drain layer extends between a pair of fins of the plurality of fins.

It is noted that FIG. 21 and FIG. 22 are linked by linking triangle A.

At 2116, the non-limiting method 2100 can comprise introducing, by the fabrication system (e.g., fabrication system 256), the source/drain layer at first spaces and second spaces, wherein the first spaces extend along a fin extension direction of the plurality of fins, between the plurality of fins and the substrate, wherein the first spaces extend along full widths, extending transverse to the fin extension direction, of the plurality of fins, and wherein the second spaces extend between and connect adjacent ones of the first spaces.

At 2118, the non-limiting method 2100 can comprise removing, by the fabrication system (e.g., fabrication system 256), remainder portions of the dielectric liner disposed along side walls of the plurality of fins, resulting in the source/drain layer having plural surface heights of plural surfaces of the source/drain layer facing the plurality of fins.

At 2120, the non-limiting method 2100 can comprise introducing, by the fabrication system (e.g., fabrication system 256), a dopant-resistant barrier layer between the source/drain layer and the plurality of fins.

At 2122, the non-limiting method 2100 can comprise performing, by the fabrication system (e.g., fabrication system 256), atomic layer etching resulting in a resultant version of the dopant-resistant barrier layer having multiple surface heights facing the plurality of fins.

At 2124, the non-limiting method 2100 can comprise removing, by the fabrication system (e.g., fabrication system 256), after replacing portions of the sacrificial semiconductor layer with the source/drain layer (and/or after introduction of the dopant-barrier layer) portions of the stacked configuration that are disposed between sections of fins of the plurality of fins.

For simplicity of explanation, the computer-implemented and non-computer-implemented methodologies provided herein are depicted and/or described as a series of acts. It is to be understood that the subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture for transporting and transferring the computer-implemented methodologies to computers. The term article of manufacture, as used herein, is intended to encompass a computer program accessible from any computer-readable device or storage media.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

In summary, one or more devices and/or methods provided herein relate to a method for fabricating a semiconductor device, and more particularly for fabricating at least a portion of a vertical transport field effect transistor. The semiconductor device comprises a field-effect transmitter comprising a substrate, a fin extending outwardly from the substrate, a source/drain region having a first portion disposed between the substrate and the fin and stacked with the fin and the substrate along a common extension direction of the fin, an excess section of semiconductor material disposed adjacent the first portion of the source/drain region and positioned other than stacked together with the substrate and the fin, wherein the semiconductor material of the excess section is different from a material of the fin and different from a material of the source/drain region.

A semiconductor device, comprises a field-effect transmitter comprising a substrate, a fin extending outwardly from the substrate, a source/drain region having a first portion disposed between the substrate and the fin and stacked with the fin and the substrate along a common extension direction of the fin, and an excess section of semiconductor material disposed adjacent the first portion of the source/drain region and positioned other than stacked together with the substrate and the fin, wherein the semiconductor material of the excess section is different from a material of the fin and different from a material of the source/drain region.

The semiconductor device can optionally further comprise a shallow trench isolation (STI) section, wherein the excess section is disposed between the STI section and the first portion of the source/drain region.

Regarding the semiconductor device of any preceding clause, the excess section of semiconductor material can comprise silicon-based material.

The semiconductor device of any preceding clause, further comprising a dopant-resistant barrier layer stacked together with and disposed between the fin and the source/drain region along the extension direction of the fin.

Regarding the semiconductor device of the preceding clause, the dopant-resistant barrier layer further extends along and covers the excess section.

Regarding the semiconductor device of any preceding clause, the source/drain region has multiple surface heights facing the fin.

The semiconductor device of any preceding clause, further comprising a second fin, wherein the fin is a first fin, wherein the source/drain region has a third portion disposed directly between the substrate and the second fin, and wherein the source/drain region extends continuously from the first portion to the third portion along a second portion disposed between the first portion and the third portion.

The semiconductor device of any preceding clause, further comprising a depression formed adjacent the fin into a surface of the source/drain region facing the fin.

An electronic structure comprises a substrate, a fin extending outwardly from the substrate and having a fin surface facing towards the substrate, and a source/drain region having a first portion disposed between the substrate and the fin, wherein the first portion is stacked together with the substrate and the fin along an extension direction of the fin, wherein the first portion has a first surface facing towards the fin surface, wherein the source/drain region has a second portion disposed adjacent to the first portion and positioned other than stacked together with the substrate and the fin, wherein the second portion has a second surface facing towards the fin surface, and wherein a first distance along the extension direction of the fin between the fin surface and the first surface is less than a second distance along the extension direction of the fin between the fin surface and the second surface.

Regarding the electronic structure of the preceding clause, optionally, the substrate has a first section stacked with the fin and the first portion of the source/drain region along the extension direction of the fin, wherein the first section has a third surface facing towards the fin surface, wherein the substrate has a second section disposed adjacent to the first section and stacked together with the second portion of the source/drain region along the extension direction of the fin, wherein the second section has a fourth surface facing towards the fin surface, and wherein a third distance along the extension direction of the fin between the fin surface and the third surface is less than a fourth distance along the extension direction of the fin between the fin surface and the fourth surface.

Regarding the electronic structure of any preceding clause, the substrate has a first section stacked together with the fin and the first portion of the source/drain region along the extension direction of the fin, wherein the first section has a third surface facing towards the fin surface, wherein the third surface of the first section has a width in a width direction, transverse to the extension direction of the fin, and that is bounded on opposite sides by the source/drain region, and wherein the width is less than or equal to a width of the fin surface.

Regarding the electronic structure of any preceding clause, the second surface of the second portion of the source drain/region has an adjacent surface section and a proximate surface section disposed adjacent to one another, and wherein a fifth distance along the extension direction of the fin between the fin surface and the adjacent surface section is greater than a sixth distance along the extension direction of the fin between the fin surface and the proximate surface section.

The electronic structure of any preceding clause, further comprising an excess section of semiconductor material that is different from a material of the fin and different from a material of the source/drain region, wherein the excess section is disposed adjacent the first portion of the source/drain region and positioned other than stacked together with the substrate and the fin.

The electronic structure of any preceding clause, further comprising a dopant-resistant barrier layer stacked together with and disposed between the fin and first portion of the source/drain region along the extension direction of the fin.

Regarding the electronic structure of any preceding clause, the dopant-resistant barrier layer has a barrier layer surface facing towards the fin surface, and wherein a seventh distance along the extension direction of the fin between the fin surface and the barrier layer surface is greater than the second distance along the extension direction of the fin between the fin surface and the second surface.

The electronic structure of any preceding clause, further comprising a second fin, wherein the fin is a first fin, wherein the source/drain region has a third portion disposed directly between the substrate and the second fin, and wherein the source/drain region extends continuously from the first portion to the third portion along the second portion.

A method for fabricating an electronic structure by a fabrication system comprises depositing, by the fabrication system, a plurality of layers in a stacked configuration to form a plurality of fins, wherein the plurality of layers comprise a sacrificial semiconductor layer stacked between a fin semiconductor layer and a substrate layer, replacing, by the fabrication system, portions of the sacrificial semiconductor layer with a source/drain layer, wherein the source/drain layer extends between a pair of fins of the plurality of fins, and removing, by the fabrication system, after replacing portions of the sacrificial semiconductor layer with the source/drain layer, portions of the stacked configuration that are disposed between sections of fins.

The method of the preceding clause, further comprising depositing, by the fabrication system, a dielectric liner over the stacked configuration, removing, by the fabrication system, first portions of the dielectric liner, and removing, by the fabrication system, prior to removing the portions of the stacked configuration disposed between sections of fins, remainder portions of the dielectric liner disposed along side walls of the plurality of fins, resulting in the source/drain layer having multiple surface heights facing the plurality of fins.

The method of any preceding clause, further comprising forming, by the fabrication system, fins of the plurality of fins aligned with one another along a substrate lateral direction along the substrate, and forming, by the fabrication system, at least one fin of the plurality of fins into a plurality of sub-fins aligned with one another along a substrate longitudinal direction, which is transverse to the substrate lateral direction, along the substrate.

The method of any preceding clause, further comprising introducing, by the fabrication system, an organic planarization layer (OPL) to cover only portions of the plurality of fins and of the sacrificial semiconductor layer, and removing, by the fabrication system, the portions of the sacrificial semiconductor layer being only portions of the sacrificial semiconductor layer not covered by the OPL.

The method of any preceding clause, further comprising introducing, by the fabrication system, the source/drain layer at first spaces and second spaces, wherein the first spaces extend along a fin extension direction of the plurality of fins, between the plurality of fins and the substrate, wherein the first spaces extend along full widths, extending transverse to the fin extension direction, of the plurality of fins, and wherein the second spaces extend between and connect adjacent ones of the first spaces.

The method of any preceding clause, further comprising introducing, by the fabrication system, a dopant-resistant barrier layer between the source/drain layer and the plurality of fins, and performing, by the fabrication system, prior to removing the portions of the stacked configuration disposed between sections of fins, atomic layer etching resulting in the dopant-resistant barrier layer having multiple surface heights facing the plurality of fins.

An advantage of the aforementioned electronic structure and/or method can be an ability to provide a fin and epitaxial material with more efficient respective profiles. Indeed, a resultant VTFET can allow current flow from one source/drain region to another source/drain region in a shortest path directly along a fin of a VTFET, which can therefor provide lower resistance for the current flow. This can be at least because one epitaxial source/drain region can be formed directly underneath a channel of the VTFET.

Indeed, in view of the one or more embodiments described herein, a practical application of the electronic structures, methods of fabrication and/or methods of use described herein can be ability to provide a VTFET having an epitaxial source/drain region can be formed directly underneath a channel of the VTFET.

Furthermore, one or more embodiments described herein can be employed in a real-world system based on the disclosed teachings. For example, one or more electronic structure embodiments described herein can function within an electronic system (e.g., radio system, radar system, quantum system, etc.) such that a current can be directed across a fin of a VTFET as described herein, between the bottom epitaxial material and another source/drain region opposite the bottom epitaxial material (e.g., across the fin).

Moreover, an electronic structure and/or method described herein can be implemented in one or more domains to enable scaled use and/or fabrication. Indeed, fabrication of more than one fin and/or more than one electronic structure as described herein can be performed at least partially in parallel with one another. Likewise, a VTFET as described herein with more than one fin and/or use of more than one VTFETs as described herein can be operated at least partially in parallel with one another.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

Figure 23:
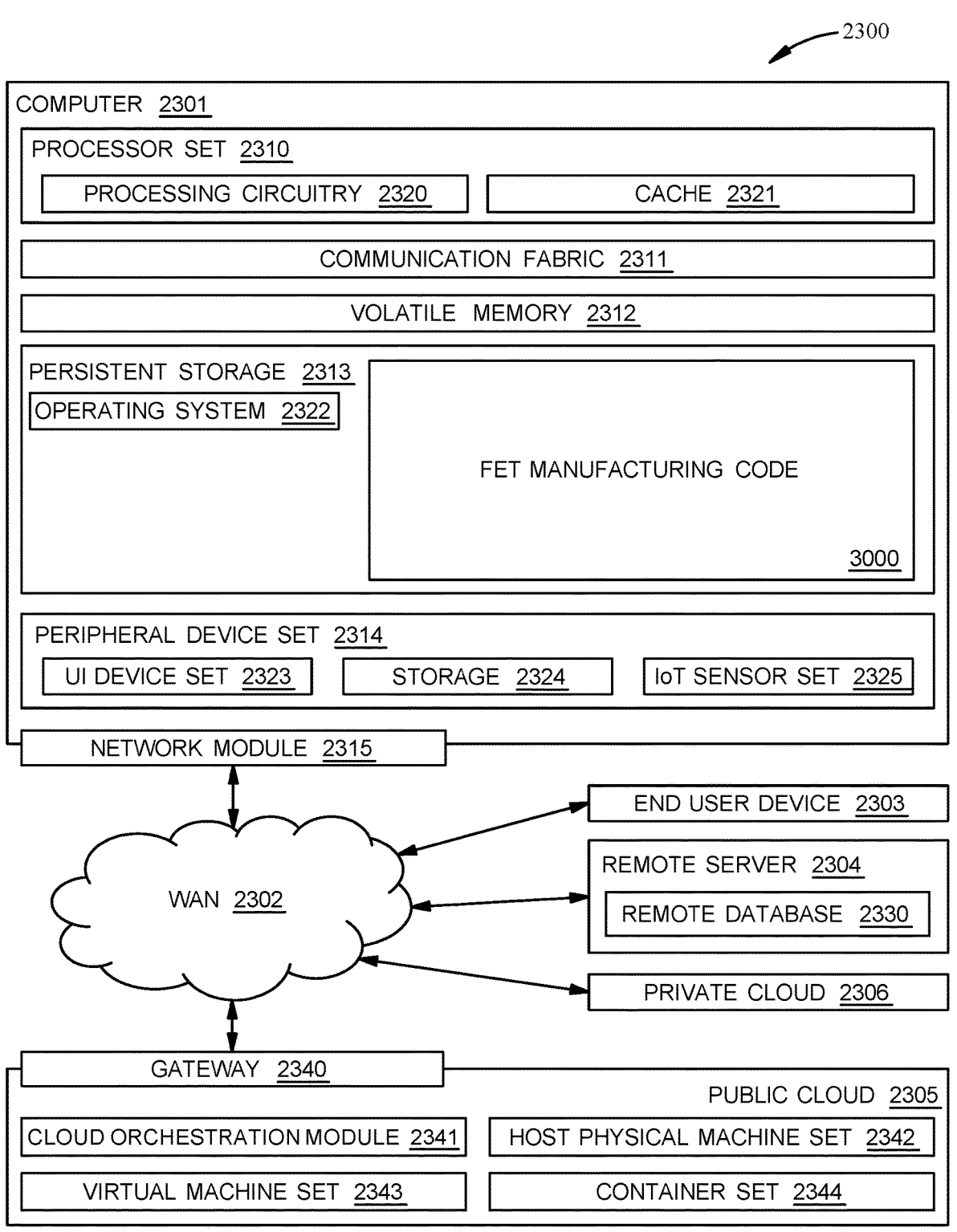
FIG. 23 illustrates a block diagram of example, non-limiting, computer environment in accordance with one or more embodiments described herein.

Turning next to FIG. 23, a detailed description is provided of additional context for the one or more embodiments described herein at FIGS. 1-22.

FIG. 23 and the following discussion are intended to provide a brief, general description of a suitable computing environment 2300 in which one or more embodiments described herein at FIGS. 1-22 can be implemented. For example, various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks can be performed in reverse order, as a single integrated step, concurrently or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium can be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 2300 contains an example of an environment for the execution of at least some of the computer code involved in performing the inventive methods, such as translation of an original source code based on a configuration of a target system by the FET manufacturing code 3000. In addition to block 3000, computing environment 2300 includes, for example, computer 2301, wide area network (WAN) 2302, end user device (EUD) 2303, remote server 2304, public cloud 2305, and private cloud 2306. In this embodiment, computer 2301 includes processor set 2310 (including processing circuitry 2320 and cache 2321), communication fabric 2311, volatile memory 2312, persistent storage 2313 (including operating system 2322 and block 3000, as identified above), peripheral device set 2314 (including user interface (UI), device set 2323, storage 2324, and Internet of Things (IoT) sensor set 2325), and network module 2315. Remote server 2304 includes remote database 2330. Public cloud 2305 includes gateway 2340, cloud orchestration module 2341, host physical machine set 2342, virtual machine set 2343, and container set 2344.

COMPUTER 2301 can take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 2330. As is well understood in the art of computer technology, and depending upon the technology, performance of a computer-implemented method can be distributed among multiple computers and/or between multiple locations. On the other hand, in this presentation of computing environment 2300, detailed discussion is focused on a single computer, specifically computer 2301, to keep the presentation as simple as possible. Computer 2301 can be located in a cloud, even though it is not shown in a cloud in FIG. 23. On the other hand, computer 2301 is not required to be in a cloud except to any extent as can be affirmatively indicated.

PROCESSOR SET 2310 includes one, or more, computer processors of any type now known or to be developed in the future. Processing circuitry 2320 can be distributed over multiple packages, for example, multiple, coordinated integrated circuit chips. Processing circuitry 2320 can implement multiple processor threads and/or multiple processor cores. Cache 2321 is memory that is located in the processor chip package(s) and is typically used for data or code that should be available for rapid access by the threads or cores running on processor set 2310. Cache memories are typically organized into multiple levels depending upon relative proximity to the processing circuitry. Alternatively, some, or all, of the cache for the processor set can be located "off chip." In some computing environments, processor set 2310 can be designed for working with qubits and performing quantum computing.

Computer readable program instructions are typically loaded onto computer 2301 to cause a series of operational steps to be performed by processor set 2310 of computer 2301 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 2321 and the other storage media discussed below. The program instructions, and associated data, are accessed by processor set 2310 to control and direct performance of the inventive methods. In computing environment 2300, at least some of the instructions for performing the inventive methods can be stored in block 3000 in persistent storage 2313.

COMMUNICATION FABRIC 2311 is the signal conduction path that allows the various components of computer 2301 to communicate with each other. Typically, this fabric is made of switches and electrically conductive paths, such as the switches and electrically conductive paths that make up busses, bridges, physical input/output ports and the like. Other types of signal communication paths can be used, such as fiber optic communication paths and/or wireless communication paths.

VOLATILE MEMORY 2312 is any type of volatile memory now known or to be developed in the future. Examples include dynamic type random access memory (RAM) or static type RAM. Typically, the volatile memory is characterized by random access, but this is not required unless affirmatively indicated. In computer 2301, the volatile memory 2312 is located in a single package and is internal to computer 2301, but, alternatively or additionally, the volatile memory can be distributed over multiple packages and/or located externally with respect to computer 2301.

PERSISTENT STORAGE 2313 is any form of non-volatile storage for computers that is now known or to be developed in the future. The non-volatility of this storage means that the stored data is maintained regardless of whether power is being supplied to computer 2301 and/or directly to persistent storage 2313. Persistent storage 2313 can be a read only memory (ROM), but typically at least a portion of the persistent storage allows writing of data, deletion of data and re-writing of data. Some familiar forms of persistent storage include magnetic disks and solid-state storage devices. Operating system 2322 can take several forms, such as various known proprietary operating systems or open-source Portable Operating System Interface type operating systems that employ a kernel. The code included in block 3000 typically includes at least some of the computer code involved in performing the inventive methods.

PERIPHERAL DEVICE SET 2314 includes the set of peripheral devices of computer 2301. Data communication connections between the peripheral devices and the other components of computer 2301 can be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 2323 can include components such as a display screen, speaker, microphone, wearable devices (such as goggles and smart watches), keyboard, mouse, printer, touchpad, game controllers, and haptic devices. Storage 2324 is external storage, such as an external hard drive, or insertable storage, such as an SD card. Storage 2324 can be persistent and/or volatile. In some embodiments, storage 2324 can take the form of a quantum computing storage device for storing data in the form of qubits. In embodiments where computer 2301 is required to have a large amount of storage (for example, where computer 2301 locally stores and manages a large database) then this storage can be provided by peripheral storage devices designed for storing large amounts of data, such as a storage area network (SAN) that is shared by multiple, geographically distributed computers. IoT sensor set 2325 is made up of sensors that can be used in Internet of Things applications. For example, one sensor can be a thermometer and another sensor can be a motion detector.

NETWORK MODULE 2315 is the collection of computer software, hardware, and firmware that allows computer 2301 to communicate with other computers through WAN 2302. Network module 2315 can include hardware, such as modems or Wi-Fi signal transceivers, software for packetizing and/or de-packetizing data for communication network transmission, and/or web browser software for communicating data over the internet. In some embodiments, network control functions and network forwarding functions of network module 2315 are performed on the same physical hardware device. In other embodiments (for example, embodiments that utilize software-defined networking (SDN)), the control functions and the forwarding functions of network module 2315 are performed on physically separate devices, such that the control functions manage several different network hardware devices. Computer readable program instructions for performing the inventive methods can typically be downloaded to computer 2301 from an external computer or external storage device through a network adapter card or network interface included in network module 2315.

WAN 2302 is any wide area network (for example, the internet) capable of communicating computer data over non-local distances by any technology for communicating computer data, now known or to be developed in the future. In some embodiments, the WAN can be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 2303 is any computer system that is used and controlled by an end user (for example, a customer of an enterprise that operates computer 2301) and can take any of the forms discussed above in connection with computer 2301. EUD 2303 typically receives helpful and useful data from the operations of computer 2301. For example, in a hypothetical case where computer 2301 is designed to provide a recommendation to an end user, this recommendation would typically be communicated from network module 2315 of computer 2301 through WAN 2302 to EUD 2303. In this way, EUD 2303 can display, or otherwise present, the recommendation to an end user. In some embodiments, EUD 2303 can be a client device, such as thin client, heavy client, mainframe computer and/or desktop computer.

REMOTE SERVER 2304 is any computer system that serves at least some data and/or functionality to computer 2301. Remote server 2304 can be controlled and used by the same entity that operates computer 2301. Remote server 2304 represents the machine(s) that collect and store helpful and useful data for use by other computers, such as computer 2301. For example, in a hypothetical case where computer 2301 is designed and programmed to provide a recommendation based on historical data, then this historical data can be provided to computer 2301 from remote database 2330 of remote server 2304.

PUBLIC CLOUD 2305 is any computer system available for use by multiple entities that provides on-demand availability of computer system resources and/or other computer capabilities, especially data storage (cloud storage) and computing power, without direct active management by the scale. The direct and active management of the computing resources of public cloud 2305 is performed by the computer hardware and/or software of cloud orchestration module 2341. The computing resources provided by public cloud 2305 are typically implemented by virtual computing environments that run on various computers making up the computers of host physical machine set 2342, which is the universe of physical computers in and/or available to public cloud 2305. The virtual computing environments (VCEs) typically take the form of virtual machines from virtual machine set 2343 and/or containers from container set 2344. It is understood that these VCEs can be stored as images and can be transferred among and between the various physical machine hosts, either as images or after instantiation of the VCE. Cloud orchestration module 2341 manages the transfer and storage of images, deploys new instantiations of VCEs and manages active instantiations of VCE deployments. Gateway 2340 is the collection of computer software, hardware and firmware allowing public cloud 2305 to communicate through WAN 2302.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 2306 is similar to public cloud 2305, except that the computing resources are only available for use by a single enterprise. While private cloud 2306 is depicted as being in communication with WAN 2302, in other embodiments a private cloud can be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 2305 and private cloud 2306 are both part of a larger hybrid cloud.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function. In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented at least partially in parallel with one or more other program modules. Generally, program modules include routines, programs, components and/or data structures that perform particular tasks and/or implement particular abstract data types. Moreover, the aforedescribed computer-implemented methods can be practiced with other computer system configurations, including single-processor and/or multiprocessor computer systems, mini-computing devices, mainframe computers, as well as computers, hand-held computing devices (e.g., PDA, phone), and/or microprocessor-based or programmable consumer and/or industrial electronics. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform" and/or "interface" can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random-access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the various embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:
1. A semiconductor device, comprising:
a field-effect transistor comprising:
    a substrate;
    a fin extending outwardly from the substrate;
    a source/drain region having a first portion disposed between the substrate and the fin and stacked with the fin and the substrate along a common extension direction of the fin;
    an excess section of semiconductor material, which is different from a material of the fin and different from a material of the source/drain region, wherein the excess section is disposed adjacent the first portion of the source/drain region and positioned other than stacked together with the substrate and the fin; and a dopant-resistant barrier layer stacked together with and disposed between the fin and the source/drain region along the common extension direction of the fin, wherein the dopant-resistant barrier layer further extends along and covers the excess section.

2. The semiconductor device of claim 1, further comprising:
a shallow trench isolation (STI) section, wherein the excess section is disposed between the STI section and the first portion of the source/drain region.

3. The semiconductor device of claim 1, where the excess section of semiconductor material comprises silicon-based material.

4. The semiconductor device of claim 1, wherein the source/drain region has multiple surface heights facing the fin.

5. The semiconductor device of claim 1, further comprising:
a second fin, wherein the fin is a first fin, wherein the source/drain region has a third portion disposed directly between the substrate and the second fin, and wherein the source/drain region extends continuously from the first portion to the third portion along a second portion disposed between the first portion and the third portion.

6. The semiconductor device of claim 1, further comprising:
a depression formed adjacent the fin into a surface of the source/drain region facing the fin.

7. A semiconductor device, comprising:
a field-effect transistor comprising:
a substrate;
a first fin extending outwardly from the substrate;
a source/drain region having a first portion disposed between the substrate and the first fin and stacked with the first fin and the substrate along a common extension direction of the first fin;

an excess section of semiconductor material, which is different from a material of the first fin and different from a material of the source/drain region, wherein the excess section is disposed adjacent the first portion of the source/drain region and positioned other than stacked together with the substrate and the first fin; and
a second fin, wherein the source/drain region has a third portion disposed directly between the substrate and the second fin, and wherein the source/drain region extends continuously from the first portion to the third portion along a second portion disposed between the first portion and the third portion.

8. The semiconductor device of claim 7, further comprising:
a shallow trench isolation (STI) section, wherein the excess section is disposed between the STI section and the first portion of the source/drain region.

9. The semiconductor device of claim 7, where the excess section of semiconductor material comprises silicon-based material.

10. The semiconductor device of claim 7, further comprising a dopant-resistant barrier layer stacked together with and disposed between the first fin and the source/drain region along the common extension direction of the first fin.

11. The semiconductor device of claim 10, wherein the dopant-resistant barrier layer further extends along and covers the excess section.

12. The semiconductor device of claim 7, wherein the source/drain region has multiple surface heights facing the first fin.

13. The semiconductor device of claim 7, further comprising:
a depression formed adjacent the first fin into a surface of the source/drain region facing the first fin.

* * * * *